US012777843B2

(12) United States Patent
Lee et al.

(10) Patent No.: US 12,777,843 B2
(45) Date of Patent: Oct. 27, 2026

(54) ORGANIC PHOTODETECTOR AND ELECTRONIC APPARATUS INCLUDING THE SAME

(71) Applicant: Samsung Display Co., Ltd., Yongin-si (KR)

(72) Inventors: Byungseok Lee, Yongin-si (KR); Soobyung Ko, Yongin-si (KR); Seokgyu Yoon, Yongin-si (KR); Minsoo Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1000 days.

(21) Appl. No.: 18/073,396

(22) Filed: Dec. 1, 2022

(65) Prior Publication Data

US 2023/0180605 A1 Jun. 8, 2023

(30) Foreign Application Priority Data

Dec. 7, 2021 (KR) ........................ 10-2021-0174013

(51) Int. Cl.
*H01L 51/50* (2006.01)
*H10K 85/60* (2023.01)
(Continued)

(52) U.S. Cl.
CPC ......... *H10K 85/6572* (2023.02); *H10K 30/30* (2023.02); *H10K 65/00* (2023.02)

(58) Field of Classification Search
None
See application file for complete search history.

(56) References Cited

U.S. PATENT DOCUMENTS

2006/0186400 A1 8/2006 Okada et al.
2021/0327979 A1 10/2021 Kamada et al.
(Continued)

FOREIGN PATENT DOCUMENTS

KR 10-2021-0055699 A 5/2021
WO WO 2019/193331 A2 * 10/2019 ............ H01L 51/46

OTHER PUBLICATIONS

Shi., et. At., Research Progress in Organic Photomultiplication Photodetectors; Nanomaterials 2018, 8, 713; 1-27 (Year: 2018).*

(Continued)

*Primary Examiner* — Gregory D Clark

(74) *Attorney, Agent, or Firm* — Womble Bond Dickinson (US) LLP

(57) ABSTRACT

An organic photodetector includes a first electrode, a second electrode facing the first electrode, and an activation layer between the first electrode and the second electrode, wherein the activation layer includes a compound represented by Formula 1. An electronic apparatus includes the organic photodetector. In Formula 1, $R_1$ to $R_6$ and a3 to a6 are as described in the specification.

Formula 1

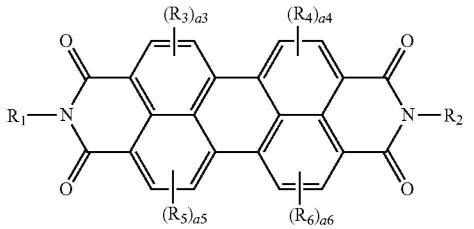

16 Claims, 6 Drawing Sheets

(51) Int. Cl.
*H10K 30/30* (2023.01)
*H10K 65/00* (2023.01)

(56) References Cited

U.S. PATENT DOCUMENTS

| | | | | |
|---|---|---|---|---|
| 2022/0367814 | A1* | 11/2022 | Malandraki | H10K 85/113 |
| 2022/0402859 | A1* | 12/2022 | Yoon | C07C 211/61 |

OTHER PUBLICATIONS

Kim, Jong Su et al., "Schottky-Barrier-Controllable Graphene Electrode to Boost Rectification in Organic Vertical P-N Junction Photodiodes", Advanced Functional Materials, 2017, pp. 1-7, vol. 1704475, Wiley-VCH Verlag GmbH & Co. KGaA, Weinheim.
Yamada, Masahiro et al., "Light-emitting Organic Photovoltaic Devices Based on Rubrene/PTCDI-C13 Stack", Electrochemistry, May 5, 2017, pp. 280-282, vol. 85(5), The Electrochemical Society of Japan.
Wu, Shuang-hong et al., "High performance small molecule photodetector with broad spectral response range from 200 to 900 nm", Applied Physics Letters, Jul. 14, 2011, pp. 1-4, vol. 99, 023305, American Institute of Physics.
Chen, Shuai et al.; "Perylene Diimide-Based Fluorescent and Colorimetric Sensors for Environmental Detection"; Sensors; 2020; 20(3); 917; Feb. 9, 2020; 28pp.
Ke, Tung-Huei et al.; "Photolithographic patterning of OLED and OPD for invisible sensor integration in mobile display"; International Conference on Display Technology; vol. 52; Issue S1; pp. 398-401. https://doi.org/10.1002/sdtp.14500; Jan. 24, 2021.
Tarsoly, Gergely et al.; "Wavelength-dependent electrical response of an organic circuit for color sensing without external filters"; Sensors and Actuators A: Physical; vol. 332; Part 2; 2021; 113178; Oct. 19, 2021.

* cited by examiner

ORGANIC PHOTODETECTOR AND ELECTRONIC APPARATUS INCLUDING THE SAME

CROSS-REFERENCE TO RELATED APPLICATION

This application claims priority to and the benefit of Korean Patent Application No. 10-2021-0174013, filed on Dec. 7, 2021, in the Korean Intellectual Property Office, the entire content of which is hereby incorporated by reference.

BACKGROUND

1. Field

One or more embodiments of the present disclosure relate to an organic photodetector and an electronic apparatus including the same.

2. Description of the Related Art

Photoelectric devices are devices that convert light and an electrical signal and include a photodiode and a phototransistor. Photoelectric devices may be applied to an image sensor, a solar cell, an organic light-emitting device, and/or the like.

In the case of silicon, which is mainly used in photodiodes, as the size of pixels decreases, an absorption region may decrease, thereby deteriorating or reducing sensitivity. Accordingly, organic materials that may replace silicon are being studied.

As organic materials have a large extinction coefficient and may selectively absorb light in a set or specific wavelength region according to the molecular structure thereof, organic materials may replace photodiodes and color filters concurrently (e.g., simultaneously), which may facilitate improvements in sensitivity and high integration.

An organic photodetector (OPD) including such an organic material may be applied to, for example, a display apparatus and/or an image sensor.

SUMMARY

Provided are an organic photodetector and an electronic apparatus including the same, the organic photodetector including an activation layer material having superior processability, mass production, and efficiency compared to those of a fullerene.

Additional aspects of embodiments will be set forth in part in the description, which follows and, in part, will be apparent from the description, or may be learned by practice of the presented embodiments of the present disclosure.

According to one or more embodiments, an organic photodetector includes a first electrode, a second electrode facing the first electrode, and an activation layer between the first electrode and the second electrode, wherein the activation layer includes a compound represented by Formula 1 below:

Formula 1

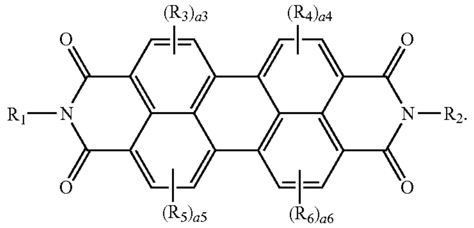

In Formula 1, $R_1$ to $R_6$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), an octyl group and a tridecyl group may be excluded from $R_1$ and $R_2$, a3 to a6 may each independently be an integer of 1 or 2, $R_{10a}$ may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formula 1, $R_1$ and $R_2$ may each independently be a $C_1$-$C_{60}$ alkyl group that is unsubstituted or substituted with at least one $R_{10a}$, and $R_3$ to $R_6$ may each independently be a $C_6$-$C_{60}$ aryl group that is unsubstituted or substituted with at least one $R_{10a}$ or a $C_1$-$C_{60}$ heteroaryl group that is unsubstituted or substituted with at least one $R_{10a}$.

In an embodiment, the activation layer may include the compound represented by Formula 1 as an electron acceptor or an electron donor.

In an embodiment, the activation layer may include the compound represented by Formula 1 and an electron donor.

In an embodiment, the activation layer may include a layer including the compound represented by Formula 1, and a layer including an electron donor.

In an embodiment, the layer including the compound represented by Formula 1 and the layer including the electron donor may be in contact (e.g., physical contact) with each other.

In an embodiment, the activation layer may include a layer including a mixture of the compound represented by Formula 1 and an electron donor.

In an embodiment, the activation layer may include a layer consisting of the compound represented by Formula 1.

In an embodiment, the activation layer may include a layer including an electron donor, a layer including a mixture of the compound represented by Formula 1 and an electron donor, and a layer consisting of the compound represented by Formula 1.

In an embodiment, the layer including the electron donor and the layer including the mixture of the compound represented by Formula 1 and the electron donor may be in contact (e.g., physical contact) with each other, and the layer including the mixture of the compound represented by Formula 1 and the electron donor and the layer consisting of the compound represented by Formula 1 may be in contact (e.g., physical contact) with each other.

In an embodiment, the activation layer may include a layer including a mixture of a hole transporting material and the compound represented by Formula 1.

In an embodiment, the activation layer may include a p-dopant.

In an embodiment, the first electrode may be an anode, the second electrode may be a cathode, the organic photodetector may further include a hole transport region between the activation layer and the first electrode, and the hole transport region may include a hole injection layer, a hole transport layer, an auxiliary layer, an electron blocking layer, or any combination thereof.

In an embodiment, the first electrode may be an anode, the second electrode may be a cathode, the organic photodetector may further include an electron transport region between the activation layer and the second electrode, and the electron transport region may include a buffer layer, a hole blocking layer, an electron transport layer, an electron injection layer, or a combination thereof.

According to one or more embodiments, an electronic apparatus includes the organic photodetector.

In an embodiment, the electronic apparatus may further include a light-emitting device.

According to one or more embodiments, an electronic apparatus includes a substrate including a light detection region and an emission region, an organic photodetector on the light detection region, and a light-emitting device on the emission region, wherein the organic photodetector includes a first pixel electrode, a counter electrode facing the first pixel electrode, and a hole transport region, an activation layer, and an electron transport region, which are sequentially between the first pixel electrode and the counter electrode, the light-emitting device includes a second pixel electrode, the counter electrode facing the second pixel electrode, and the hole transport region, an emission layer, and the electron transport region, which are sequentially between the second pixel electrode and the counter electrode, the first pixel electrode and the activation layer are arranged in correspondence with the light detection region, the second pixel electrode and the emission layer are arranged in correspondence with the emission region, the hole transport region, the electron transport region, and the counter electrode are arranged throughout the light detection region and the emission region, and the activation layer includes the compound represented by Formula 1

Formula 1

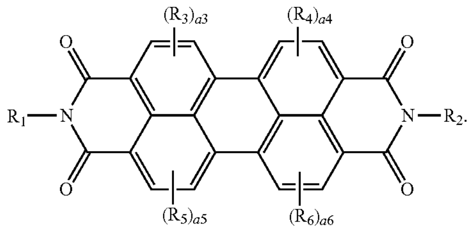

In Formula 1, $R_1$ to $R_6$ and a3 to a6 are respectively the same as described above.

The hole transport region and the electron transport region are respectively the same as described below.

BRIEF DESCRIPTION OF THE DRAWINGS

The above and other aspects and features of certain embodiments of the present disclosure will be more apparent from the following description taken in conjunction with the accompanying drawings, in which.

DETAILED DESCRIPTION

Figure 1:
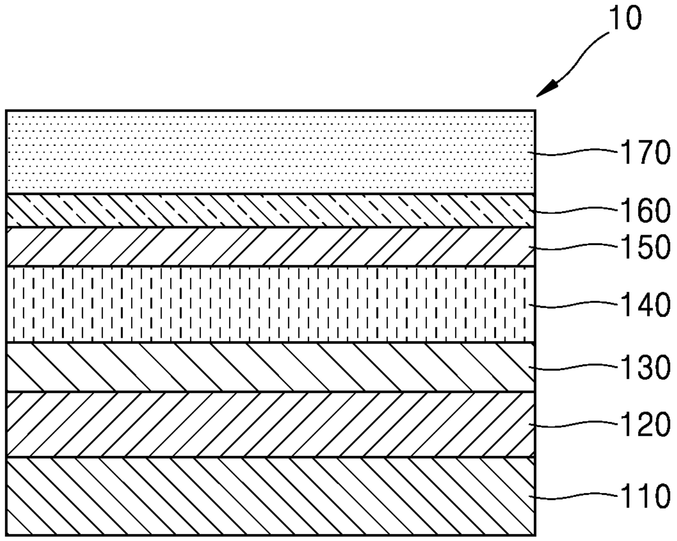
FIG. 1 is a schematic view of a structure of an organic photodetector according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, embodiments are merely described below, by referring to the figures, to explain aspects of embodiments of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

The subject matter of the present disclosure may include various modifications and various embodiments, and example embodiments will be illustrated in the drawings and described in more detail in the detailed description. Effects and features of embodiments of the present disclosure, and implementation methods therefor will become clear with reference to the embodiments described herein below together with the drawings. The subject matter of the present disclosure may, however, be embodied in many different forms and should not be construed as limited to the embodiments set forth herein.

As used herein, the singular forms "a," "an" and "the" are intended to include the plural forms as well, unless the context clearly indicates otherwise.

As used herein, the terms "comprise", "include", "have", and the like, specify the presence of stated features and/or components, and do not exclude the presence of addition of one or more other features and/or components.

It will be understood that when a layer, region, or component is referred to as being "on" or "onto" another layer, region, or component, it may be directly or indirectly formed over the other layer, region, or component. For example, intervening layers, regions, or components may be present.

Like reference numerals in the drawings denote like elements, and thus duplicative description thereof may not be repeated.

Sizes of components in the drawings may be exaggerated for convenience of explanation. In other words, the sizes and thicknesses of elements may be arbitrarily illustrated in the drawings for the convenience of explanation, and the present disclosure is not limited thereto.

Description of FIG. 1

FIG. 1 schematically shows a cross-sectional view of an organic photodetector 10 according to an embodiment.

Referring to FIG. 1, the organic photodetector 10 according to an embodiment may include: a first electrode 110; a second electrode 170 facing the first electrode 110; an activation layer 140 between the first electrode 110 and the second electrode 170; an electron injection layer 160 between the activation layer 140 and the second electrode 170; an electron transport layer 150; a buffer layer; and a hole injection layer 120, a hole transport layer 130, and an auxiliary layer, which are between the first electrode 110 and the activation layer 140.

In FIG. 1, for example, in some cases, the electron injection layer 160, the electron transport layer 150, the buffer layer, the hole injection layer 120, the hole transport layer 130, and the auxiliary layer may each independently be present or may not each independently be present.

In the related art, the activation layer 140 includes a fullerene (C60) as a representative electron acceptor material.

However, fullerenes require a high deposition temperature of 500° C. or higher and special additional measures due to characteristics of popping up (e.g., exploding) when heated during processing (e.g., deposition). Also, because the price of fullerenes is high, the unit price of a final product is eventually increased.

In an embodiment, the activation layer 140 may include a compound represented by Formula 1 below:

Formula 1

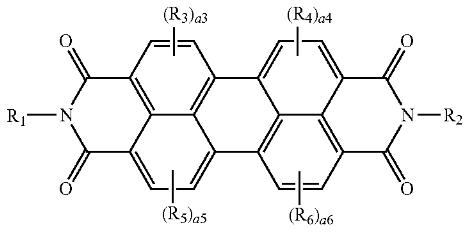

wherein, in Formula 1, $R_1$ to $R_6$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, or $—P(=S)(Q_1)(Q_2)$, an octyl group and a tridecyl group may be excluded from $R_1$ and $R_2$, a3 to a6 may each independently be an integer of 1 or 2, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formula 1, $R_1$ and $R_2$ may each independently be a $C_1$-$C_{60}$ alkyl group that is unsubstituted or substituted with at least one $R_{10a}$, and $R_3$ to $R_6$ may each independently be a $C_6$-$C_{60}$ aryl group that is unsubstituted or substituted with at least one $R_{10a}$ or a $C_1$-$C_{60}$ heteroaryl group that is unsubstituted or substituted with at least one $R_{10a}$.

In an embodiment, $R_3$ to $R_6$ may each independently be a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, or a naphthyridinyl group, each unsubstituted or substituted with at least one $R_{10a}$.

In an embodiment, the compound represented by Formula 1 may be one selected from the following compounds:

A01

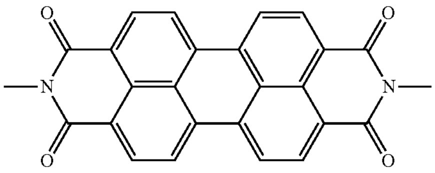

A02

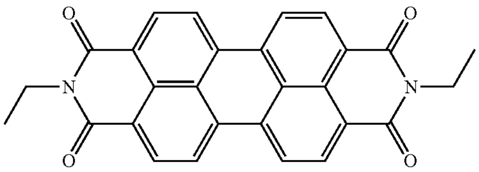

A03

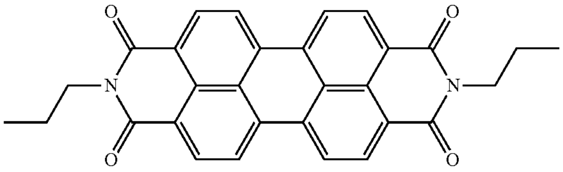

A04

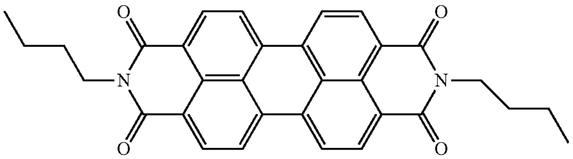

A05

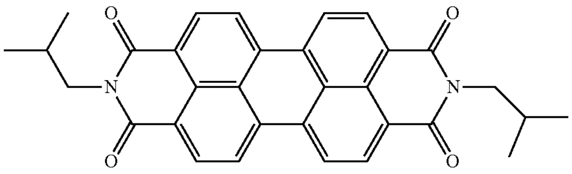

A06

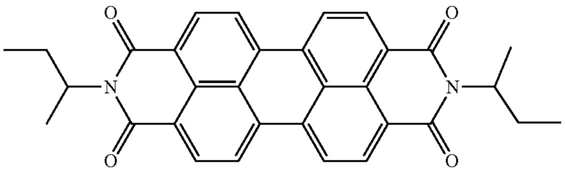

A07

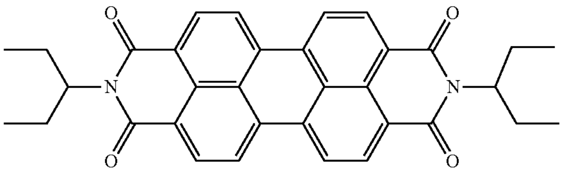

A08

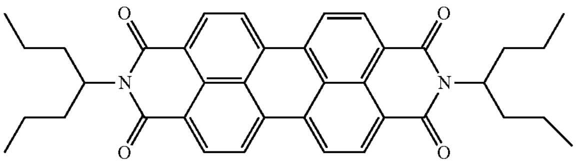

A09
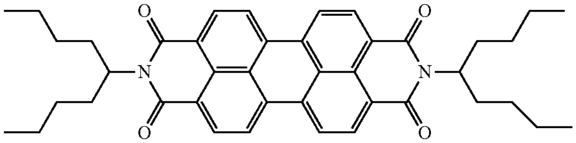
A10
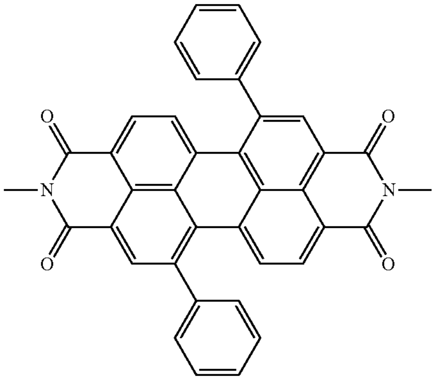
A11
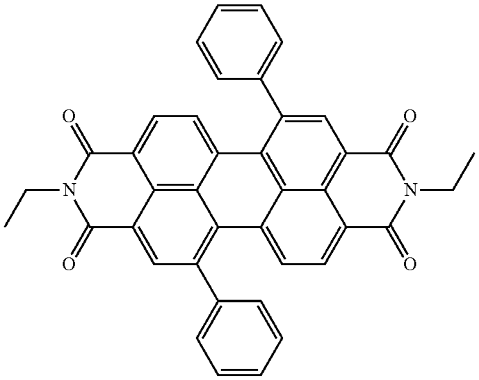
A12
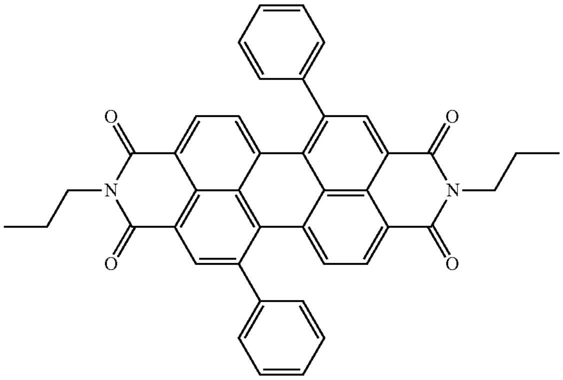
A13
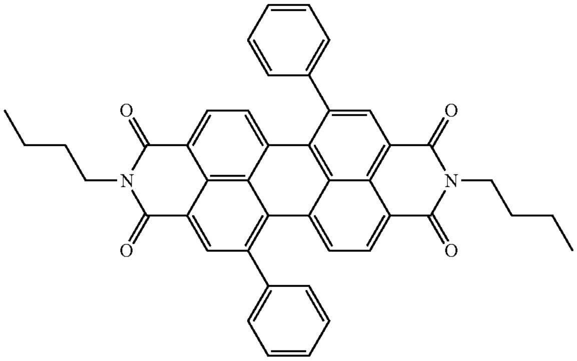
A14
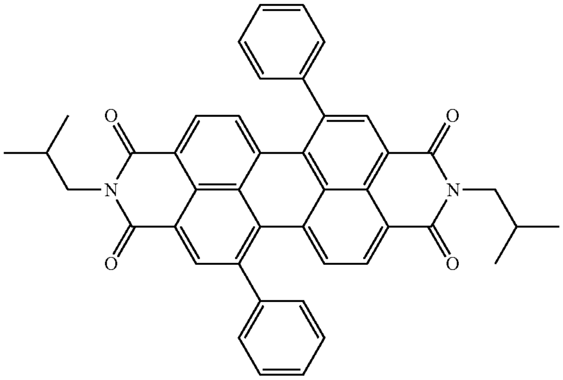
A15
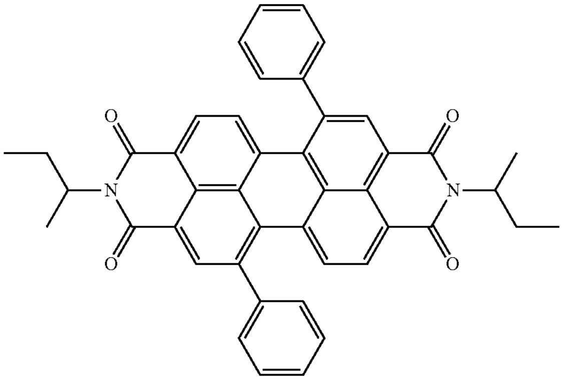
A16
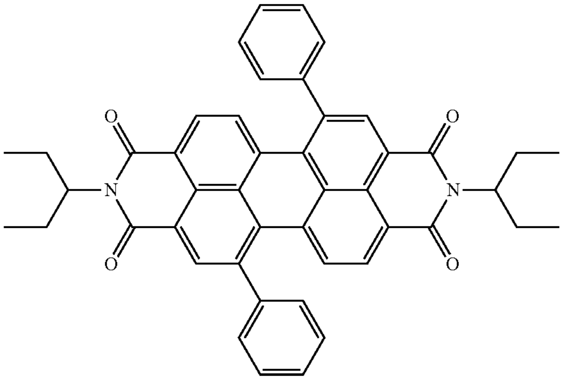

-continued

A17

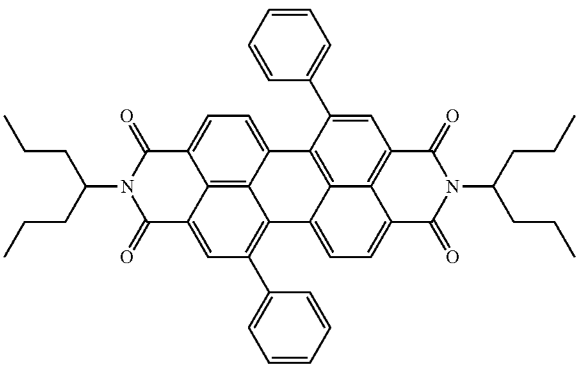

A18

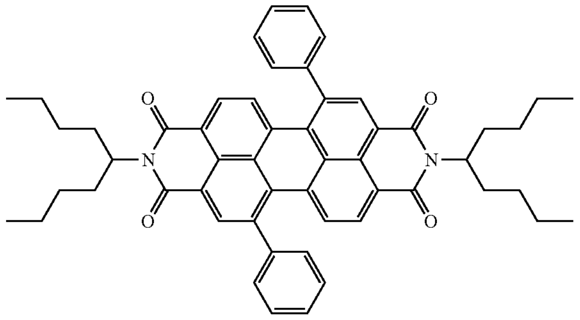

The compound represented by Formula 1 according to an embodiment of the present disclosure does not have special problems during processing and is not expensive, as compared to fullerenes. In an embodiment, it has been confirmed that efficiency of an organic photodetector using the compound represented by Formula 1 has shown an excellent result as compared to fullerenes.

The activation layer 140 generates excitons by receiving light from the outside (e.g., external light) and divides the generated excitons into holes and electrons. The activation layer 140 may include an electron donor and an electron acceptor.

In an embodiment, the activation layer 140 may include the compound represented by Formula 1 as an electron acceptor or an electron donor.

The compound represented by Formula 1 may act as an electron acceptor or an electron donor. In an embodiment, the activation layer 140 may include: the compound represented by Formula 1; and an electron donor or an electron acceptor.

In an embodiment, the activation layer 140 may include: a layer including the compound represented by Formula 1; and a layer including an electron donor or an electron acceptor. In this case, the compound represented by Formula 1 may act as the electron acceptor or the electron donor.

In an embodiment, the layer including the compound represented by Formula 1 and the layer including the electron donor or the electron acceptor may be in contact with each other. The layer including the compound represented by Formula 1 and the layer including the electron donor or the electron acceptor may physically be in direct contact with each other (e.g., direct physical contact with each other with no intervening layers or components therebetween).

In an embodiment, the layer including the compound represented by Formula 1 and the layer including the electron donor or the electron acceptor may form a PN junction. Excitons may be efficiently separated into holes and electrons by photo-induced charge separation occurring at an interface between these layers. Furthermore, because the activation layer 140 is separated into the layer including the compound represented by Formula 1 and the layer including the electron donor, holes and electrons generated at the interface may be easily trapped or may easily migrate.

In an embodiment, the activation layer 140 may include a layer including a mixture of the compound represented by Formula 1 and an electron donor or an electron acceptor. In this case, the compound represented by Formula 1 may act as the electron acceptor or the electron donor. In this case, the activation layer 140 may be formed by co-depositing the compound represented by Formula 1 and the electron donor or the electron acceptor. When the activation layer 140 is a mixed layer, excitons may be generated with a diffusion distance from a donor-acceptor interface, and thus, the organic photodetector may have improved external quantum efficiency. A ratio of the compound represented by Formula 1 and the electron donor or the electron acceptor may be, for example, in a range of 10:90 to 90:10 (weight ratio).

In an embodiment, the activation layer 140 may include a layer consisting of the compound represented by Formula 1. In this case, the compound represented by Formula 1 may act as an electron acceptor, an electron transport material, and/or an electron donor.

In an embodiment, the activation layer may include:

a layer including an electron donor or an electron acceptor;

a layer including a mixture of the compound represented by Formula 1 and an electron donor or an electron acceptor; and a layer consisting of the compound represented by Formula 1.

In this case, the compound represented by Formula 1 may act as the electron acceptor or the electron donor. In the layer including the mixture of the compound represented by Formula 1 and the electron donor or the electron acceptor, a ratio of the compound represented by Formula 1 and the electron donor or the electron acceptor may be in a range of, for example, 10:90 to 90:10 (weight ratio).

In an embodiment, the layer including the electron donor or the electron acceptor and the layer including the mixture of the compound represented by Formula 1 and the electron donor or the electron acceptor may be in contact (e.g., physical contact) with each other, and the layer including the mixture of the compound represented by Formula 1 and the electron donor or the electron acceptor and the layer consisting of the compound represented by Formula 1 may be in contact (e.g., physical contact) with each other.

In an embodiment, the layer including the electron donor or the electron acceptor and the layer including the mixture of the compound represented by Formula 1 and the electron donor or the electron acceptor may physically be in direct contact with each other (e.g., may be in direct physical contact with no other layers or components therebetween), and the layer including the mixture of the compound represented by Formula 1 and the electron donor or the electron acceptor and the layer consisting of the compound represented by Formula 1 may physically be in direct contact with each other (e.g., may be in direct physical contact with no other layers or components therebetween).

In an embodiment, the activation layer may include a layer including a mixture of a hole transporting material and the compound represented by Formula 1. The hole transporting material will be further described herein below. A ratio of the hole transporting material and the compound represented by Formula 1 may be in a range of, for example, 10:90 to 90:10 (weight ratio).

In an embodiment, the activation layer 140 may include a p-dopant. The p-dopant may be homogeneously or non-homogeneously dispersed in the activation layer 140. The activation layer 140 is doped with the p-dopant, and thus, external quantum efficiency may be improved by the charge injection principle by an electric field. The p-dopant will be further described herein below.

In an embodiment, the electron donor may be an organic or inorganic material having a lowest unoccupied molecular orbital (LUMO) energy level deeper than about −2 eV and a highest occupied molecular orbital (HOMO) energy level deeper than about −3 eV. In an embodiment, the electron donor may be an organic and/or inorganic material having a LUMO energy level of about −3 eV to about −5 eV and a HOMO energy level of about −4 eV to about −7 eV. In an embodiment, the electron donor may be boron subphthalocyanine chloride (SubPc), copper(II) phthalocyanine (CuPc), tetraphenyldibenzoperiflanthene (DBP), or any combination thereof.

In an embodiment, the electron acceptor may be an organic and/or inorganic material having a LUMO energy level deeper than about −3 eV and a HOMO energy level deeper than about −4 eV. In an embodiment, the electron acceptor may be an organic or inorganic material having a LUMO energy level of about −4 eV to about −6 eV and a HOMO energy level of about −5 eV to about −8 eV. In an embodiment, the electron acceptor may be a C60 fullerene, HATCN, TCNQ, etc.

One selected from the first electrode 110 and the second electrode 170 may be an anode, and the other one may be a cathode. In an embodiment, the first electrode 110 may be an anode, and the second electrode 170 may be a cathode.

A hole transport region of the organic photodetector 10 may include a structure in which the hole injection layer 120, the hole transport layer 130, an auxiliary layer, an electron blocking layer, or any combination thereof are on the first electrode 110. In an embodiment, the auxiliary layer may be between the hole transport layer 130 and the activation layer 140.

An electron transport region of the organic photodetector 10 may include a structure in which a buffer layer, a hole blocking layer, the electron transport layer 150, the electron injection layer 160, or any combination thereof are on the activation layer 140. In an embodiment, the buffer layer may be between the electron transport layer 150 and the activation layer 140.

In an embodiment, the p-dopant may include a quinone derivative, a cyano group-containing compound, a compound including element EL1 and element EL2, or any combination thereof.

Examples of the quinone derivative may include TCNQ, F4-TCNQ, etc.

Examples of the cyano group-containing compound may include HAT-CN, a compound represented by Formula 221 below, etc.:

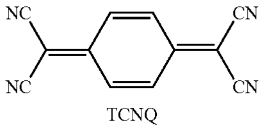

TCNQ

-continued

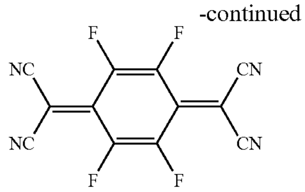

F4-TCNQ

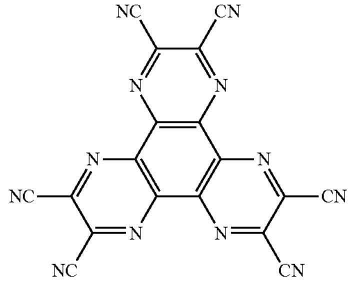

HAT-CN

Formula 221

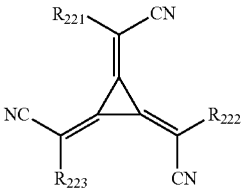

wherein, in Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one selected from $R_{221}$ to $R_{223}$ may each independently be: a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group that is substituted with a cyano group, —F, —Cl, —Br, —I, or any combination thereof; or any combination thereof.

In the compound including element EL1 and element EL2, element EL1 may be metal, metalloid, or a combination thereof, and element EL2 may be non-metal, metalloid, or a combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing element EL1 and element EL2 may include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

In an embodiment, an amount of the p-dopant in the activation layer 140 may be in a range of about 0.1 vol % to about 10 vol %, for example, about 0.5 vol % to about 5 vol %.

The activation layer 140 may have a thickness of about 200 Å to about 2,000 Å, for example, about 400 Å to about 600 Å.

First Electrode 110

In FIG. 1, a substrate may be additionally under the first electrode 110 and/or on the second electrode 170. As the substrate, a glass substrate and/or a plastic substrate may be used. In an embodiment, the substrate may be a flexible substrate, and may include plastics having excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing and/or sputtering a material for forming the first electrode 110 on the substrate. When the first electrode 110 is an anode, the material for forming the first electrode 110 may be a high-work function material.

The first electrode 110 may be a reflective electrode, a semi-transmissive electrode, or a transmissive electrode. To form the first electrode 110 as a transmissive electrode, indium tin oxide (ITO), indium zinc oxide (IZO), tin oxide ($SnO_2$), zinc oxide (ZnO), or any combination thereof may be used as the material for forming the first electrode 110. In an embodiment, to form the first electrode 110 as a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as the material for forming the first electrode 110.

The first electrode 110 may have a single-layered structure consisting of a single layer or a multilayer structure including a plurality of layers. In an embodiment, the first electrode 110 may have a three-layered structure of ITO/Ag/ITO.

Charge Auxiliary Layer

The organic photodetector 10 according to an embodiment may include a charge auxiliary layer that facilitates migration of holes and electrons from the activation layer 140.

The charge auxiliary layer may include the hole injection layer 120 and the hole transport layer 130, which facilitate migration of holes, and may include the electron transport layer 150 and the electron injection layer 160, which facilitate migration of electrons.

Hole Transport Region

Charge auxiliary layers between the first electrode 110 and the activation layer 140 may be collectively referred to as a hole transport region.

The hole transport region may include the hole injection layer 120, the hole transport layer 130, the auxiliary layer, and the electron blocking layer.

The hole transport region may include a hole transporting material. In an embodiment, the hole transporting material may include a compound represented by Formula 201 below, a compound represented by Formula 202 below, or any combination thereof:

Formula 201

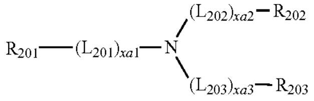

Formula 202

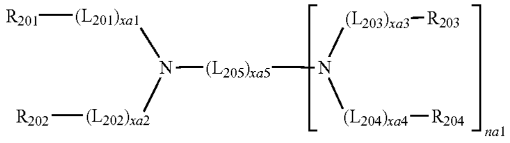

wherein, in Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{201}$ and $R_{202}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group (for example, a carbazole group and/or the like) that is unsubstituted or substituted with at least one $R_{10a}$ (for example, Compound HT16), $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group that is unsubstituted or substituted with at least one $R_{10a}$, and na1 may be an integer from 1 to 4.

In an embodiment, each of Formulae 201 and 202 may include at least one selected from groups represented by Formulae CY201 to CY217:

CY201

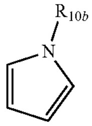

CY202

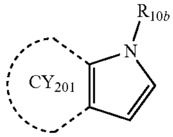

-continued

CY203

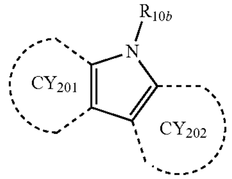

CY204

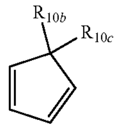

CY205

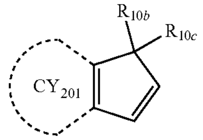

CY206

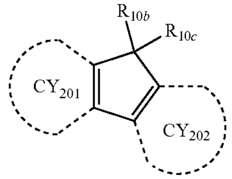

CY207

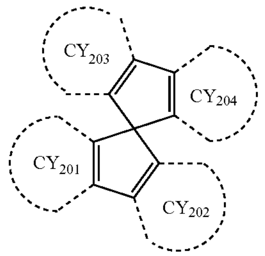

CY208

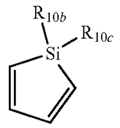

CY209

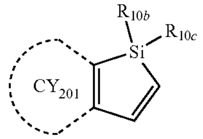

CY210

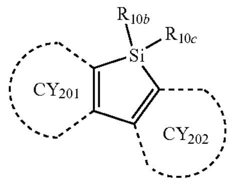

-continued

CY211

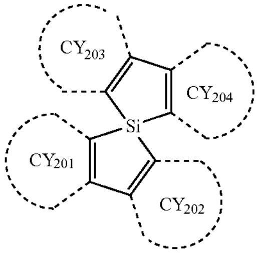

CY212

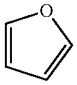

CY213

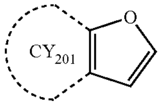

CY214

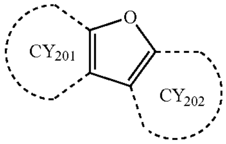

CY215

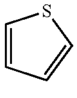

CY216

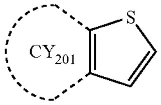

CY217

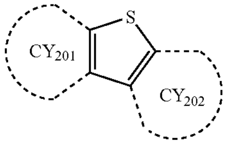

wherein, in Formulae CY201 to CY217, $R_{10b}$ and $R_{10c}$ may each be the same as described with respect to $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In an embodiment, ring CY201 to ring CY204 in Formulae CY201 to CY217 may each independently be a benzene group, a naphthalene group, a phenanthrene group, or an anthracene group.

In an embodiment, each of Formulae 201 and 202 may include at least one selected from groups represented by Formulae CY201 to CY203.

In an embodiment, Formula 201 may include at least one selected from groups represented by Formulae CY201 to CY203 and at least one selected from groups represented by Formulae CY204 to CY217.

In an embodiment, xa1 in Formula 201 may be 1, $R_{201}$ may be a group represented by one selected from Formulae CY201 to CY203, xa2 may be 0, and $R_{202}$ may be a group represented by one selected from Formulae CY204 to CY207.

In an embodiment, each of Formulae 201 and 202 may not include groups represented by Formulae CY201 to CY203.

In an embodiment, each of Formulae 201 and 202 may not include groups represented by Formulae CY201 to CY203, and may include at least one selected from groups represented by Formulae CY204 to CY217.

In an embodiment, each of Formulae 201 and 202 may not include groups represented by Formulae CY201 to CY217.

In an embodiment, the hole transporting material may include one selected from Compounds HT1 to HT46, m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

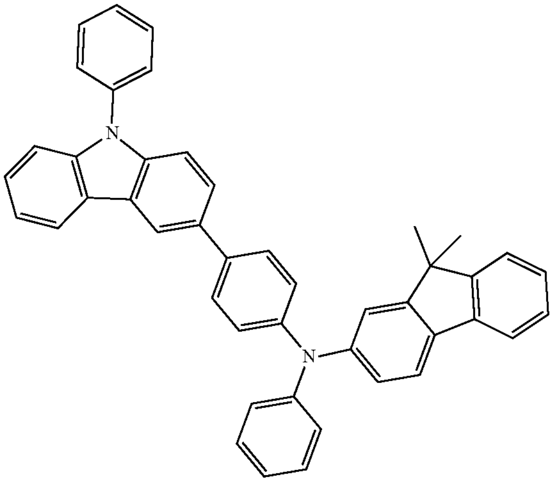

HT2

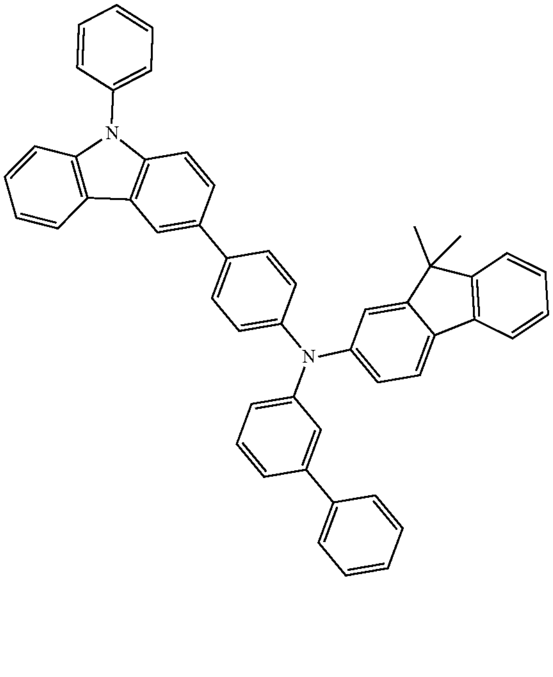

-continued
HT3
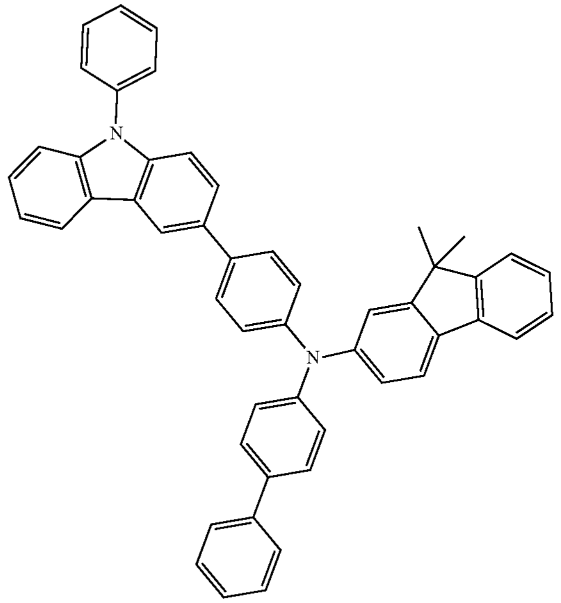
HT4
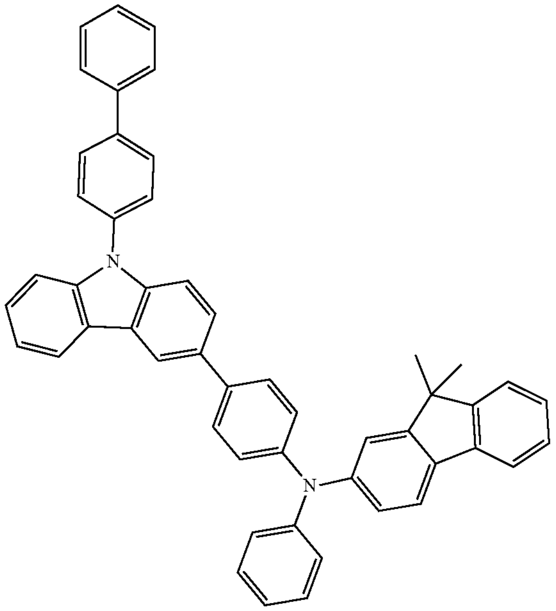
HT5
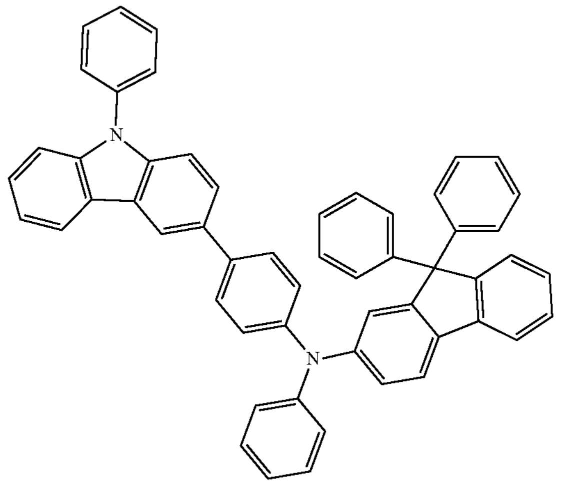
HT6
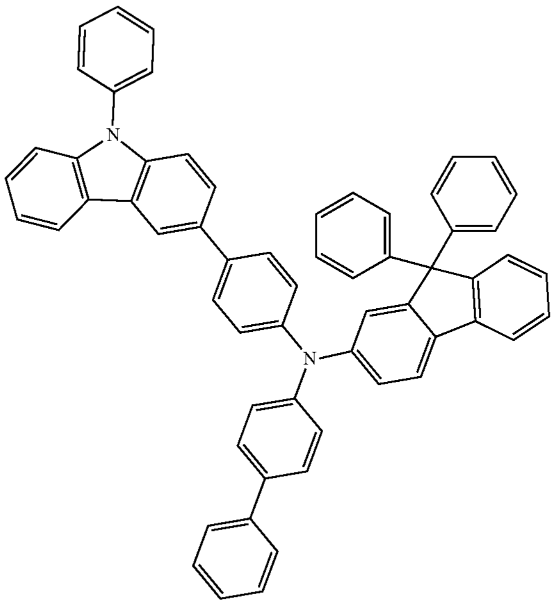

-continued
HT7
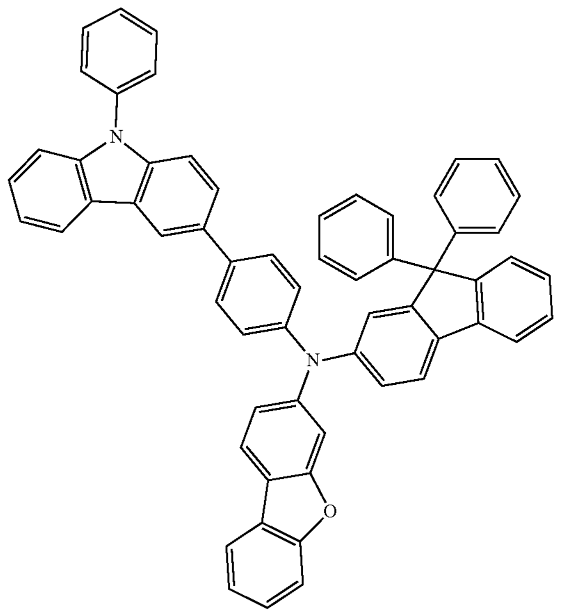
HT8
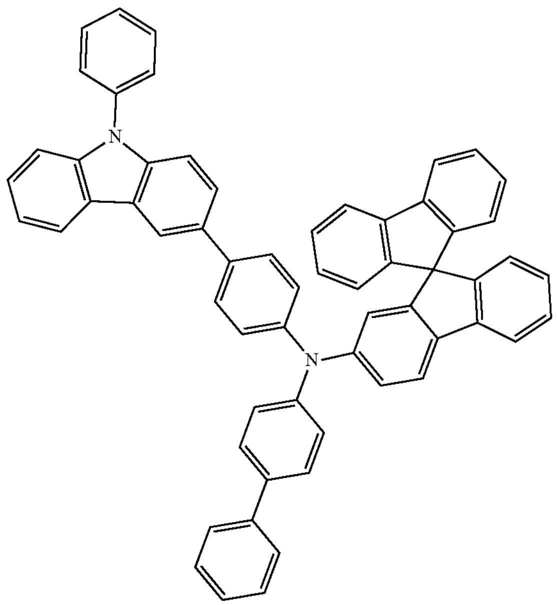
HT9
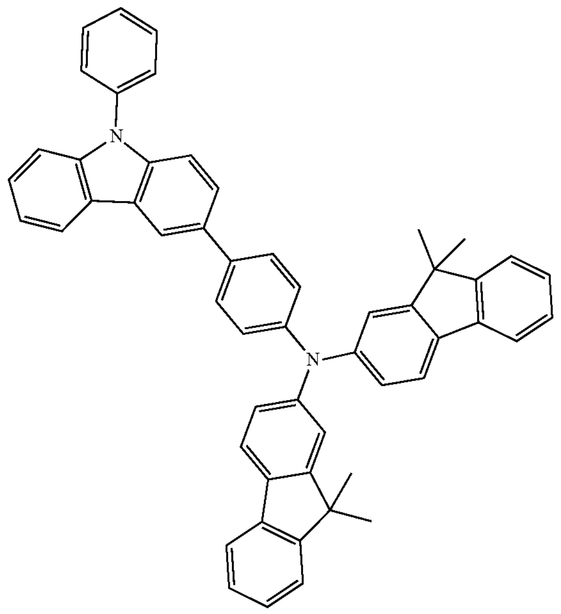
HT10
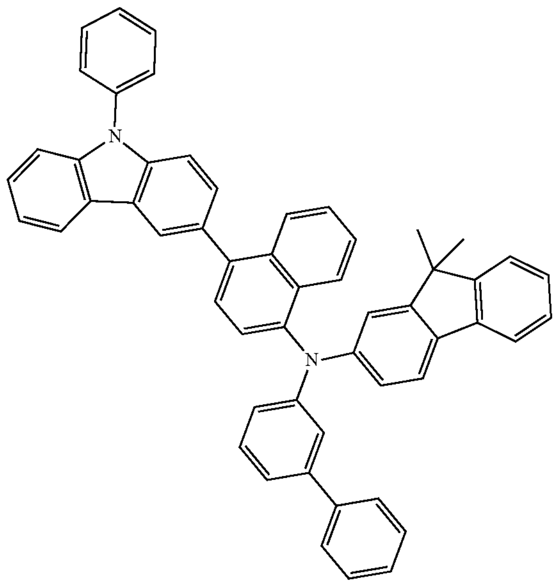

-continued
HT11
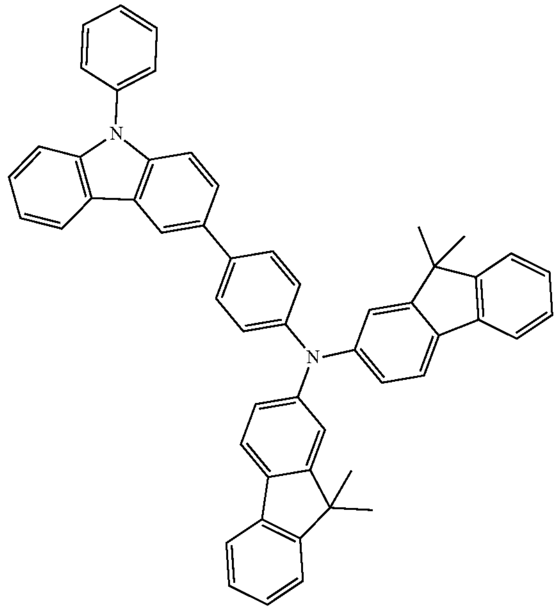
HT12
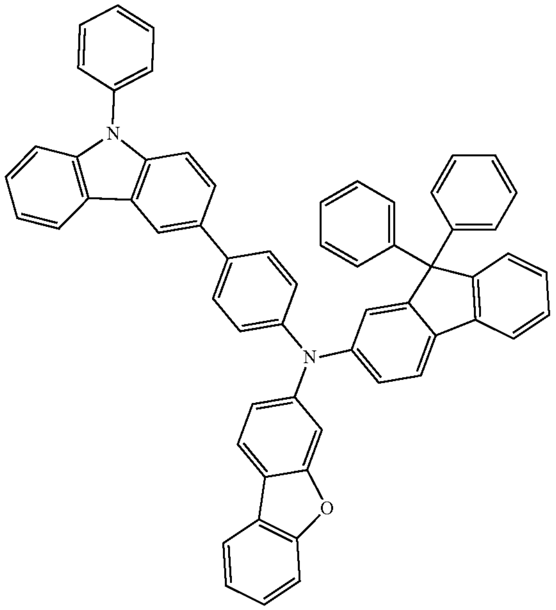
HT13
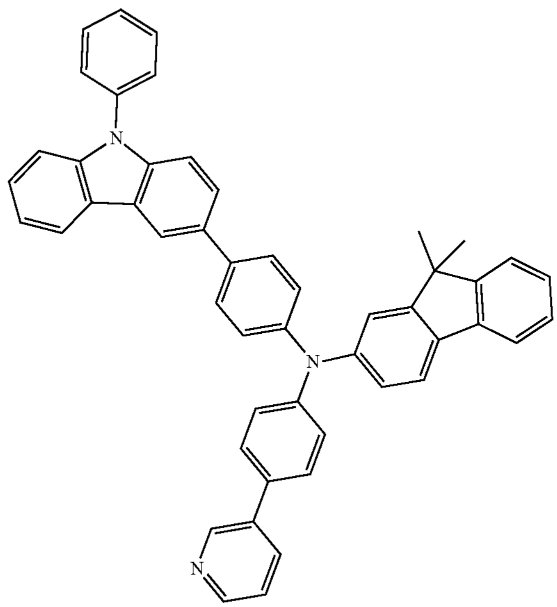
HT14
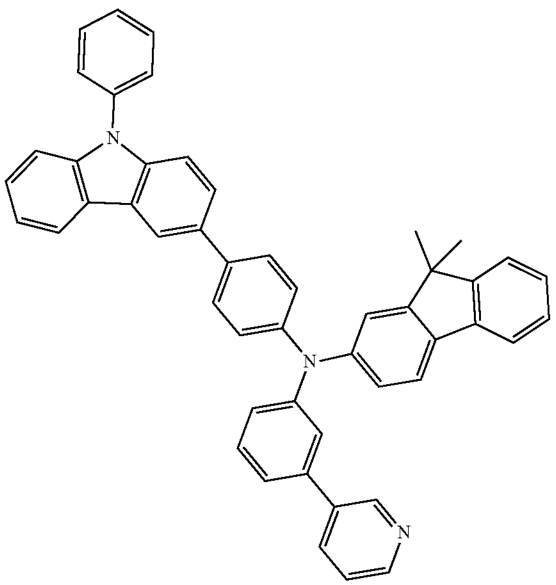

-continued
HT15
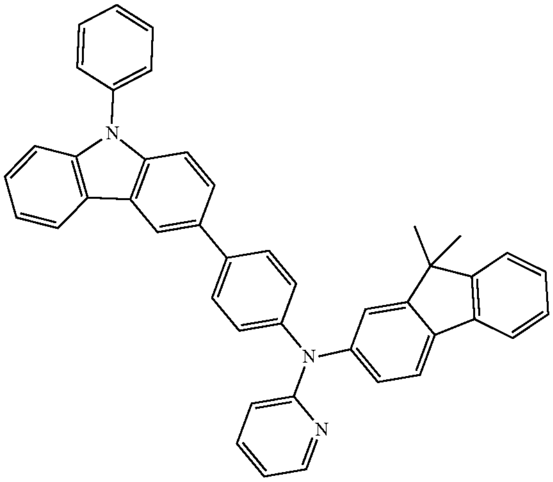
HT16
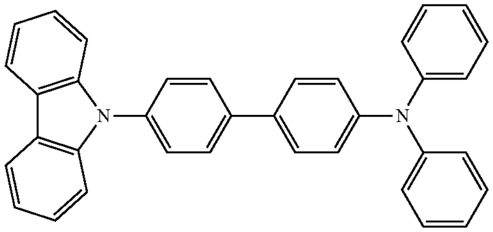
HT17
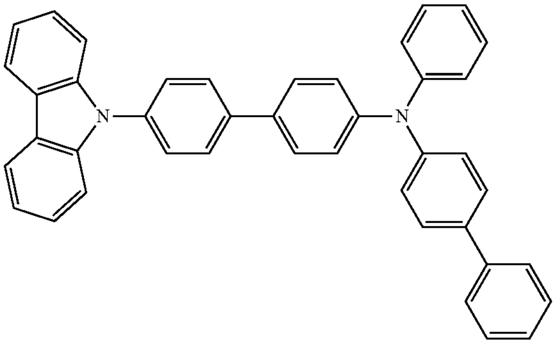
HT18
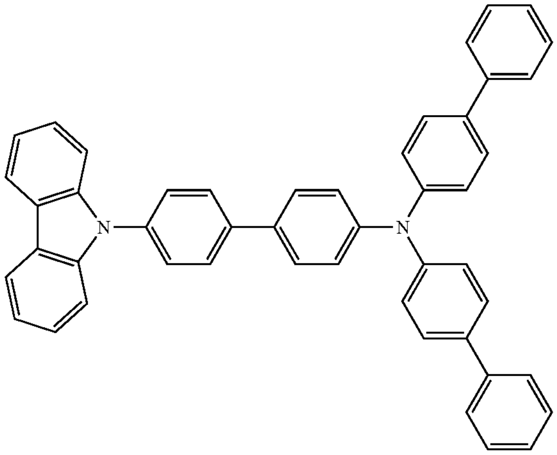
HT19
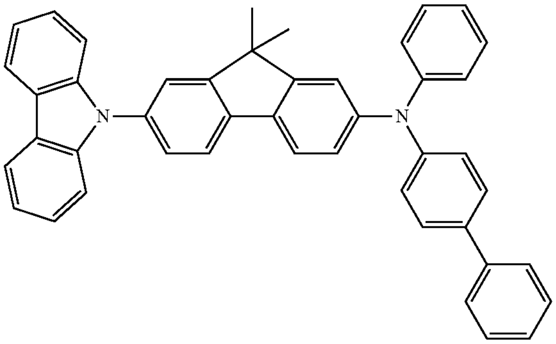
HT20
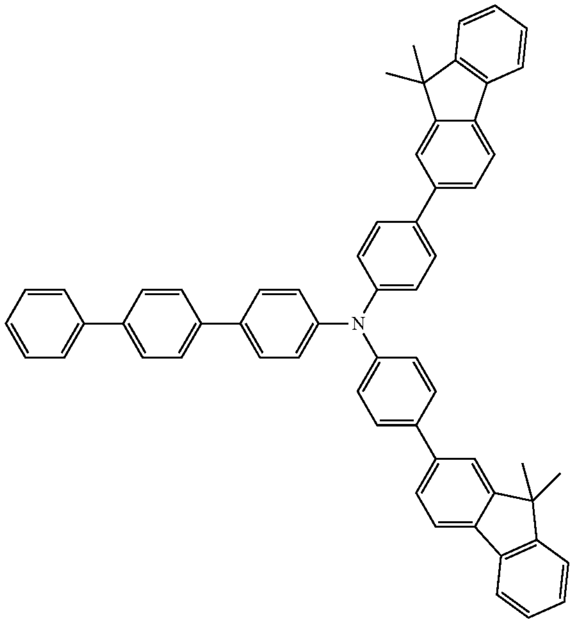

-continued
HT21
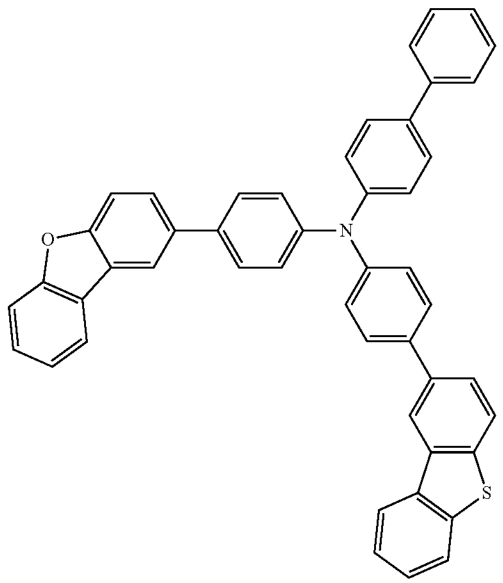
HT22
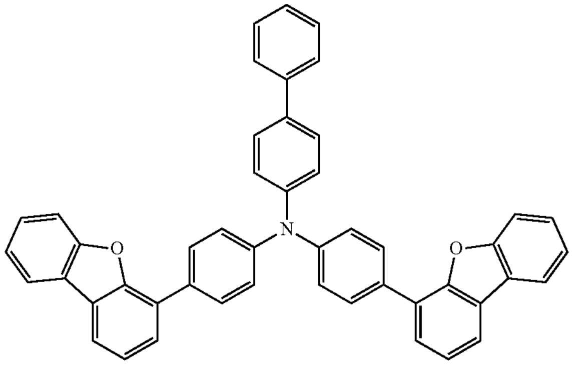
HT23
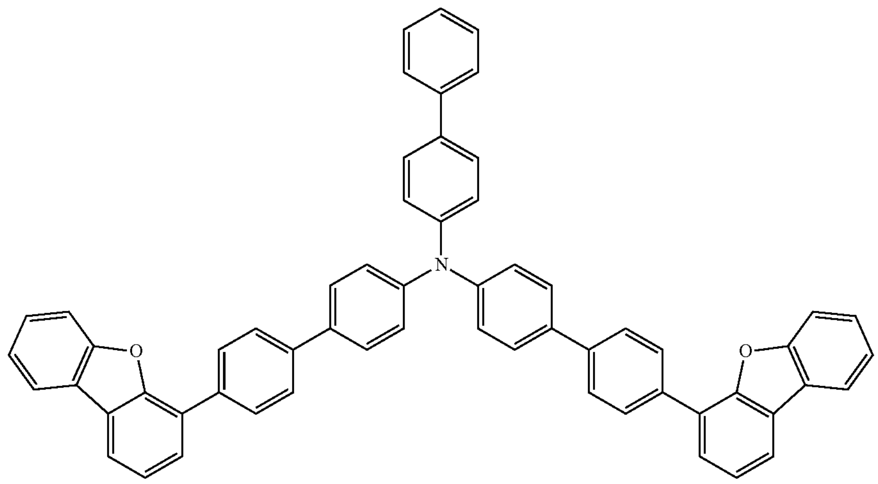
HT24
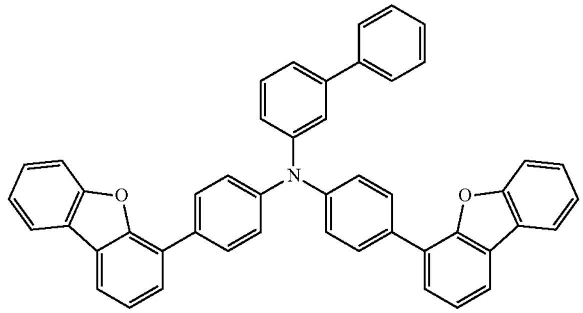
HT25
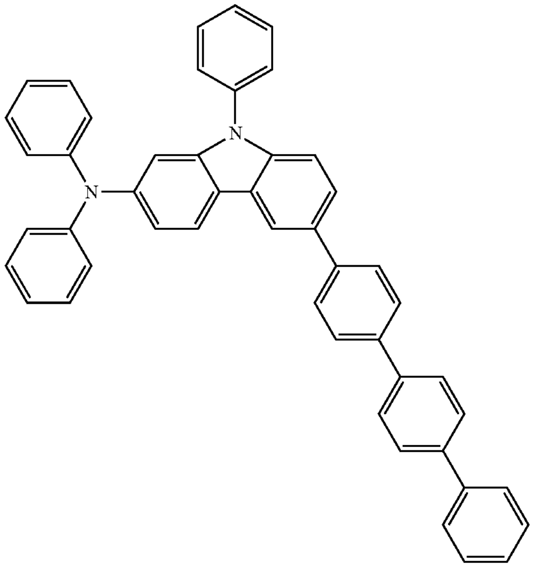

-continued
HT26
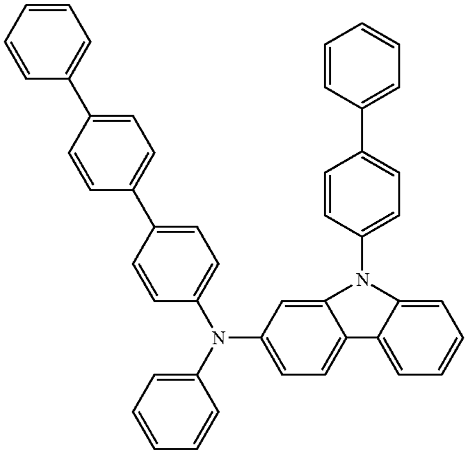
HT27
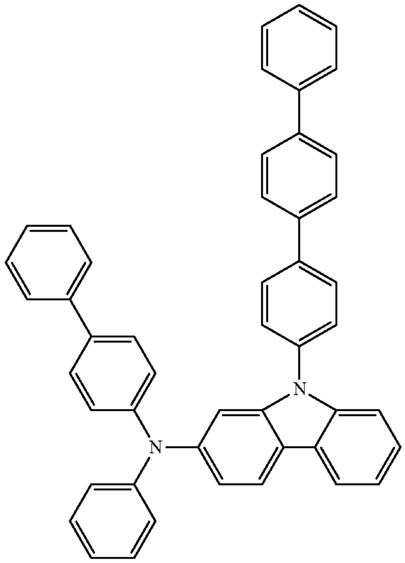
HT28
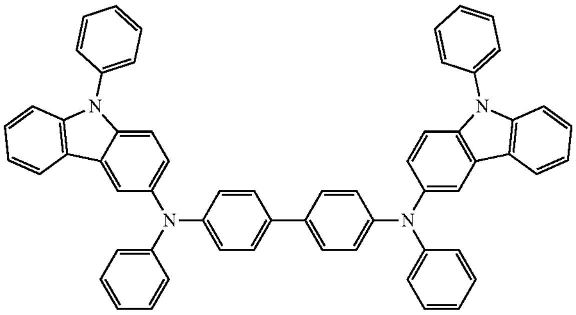
HT29
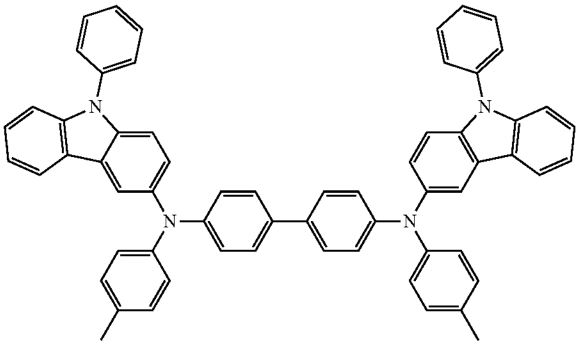
HT30
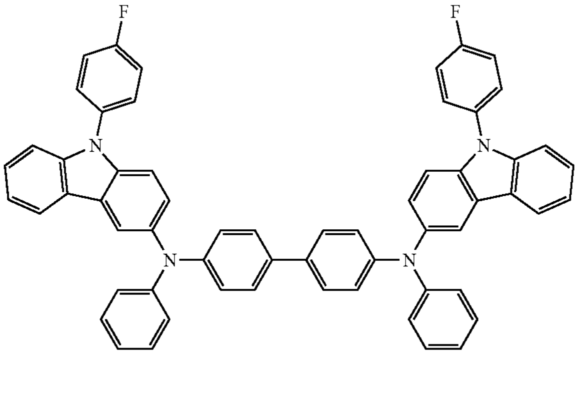
HT31
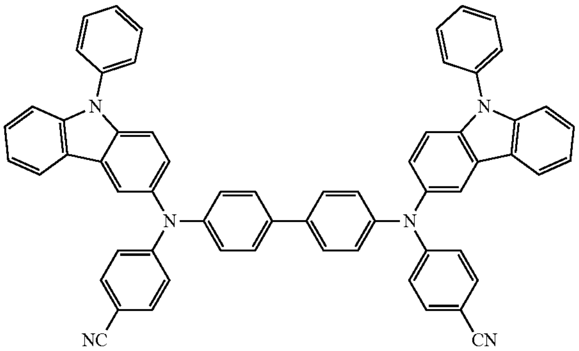

-continued
HT32
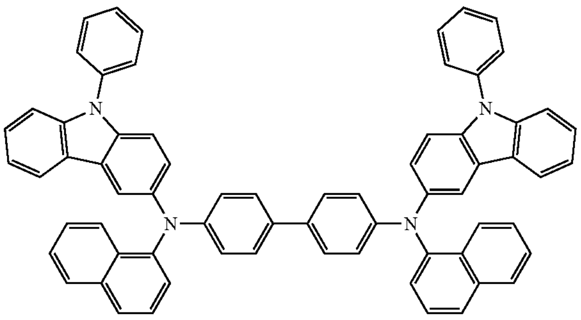
HT33
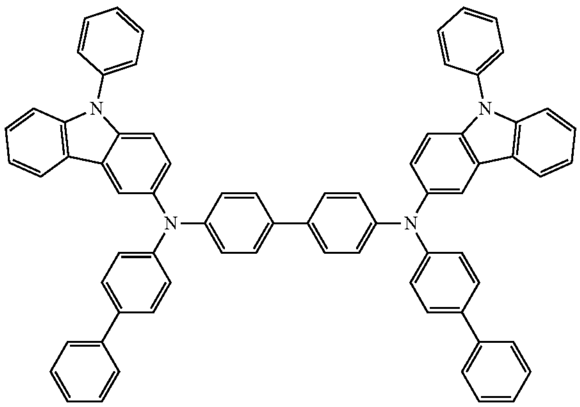
HT34
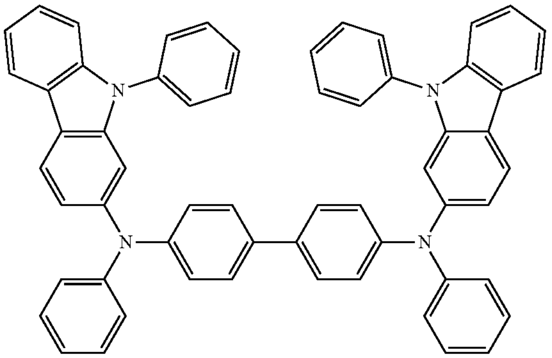
HT35
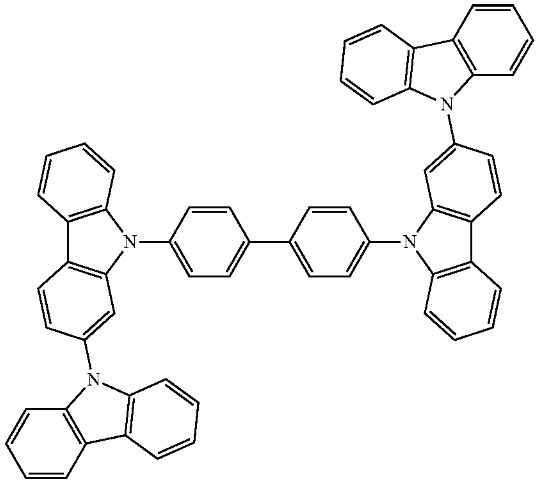
HT36
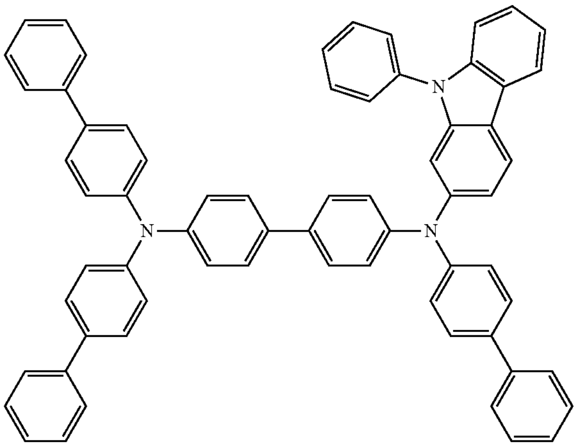
HT37
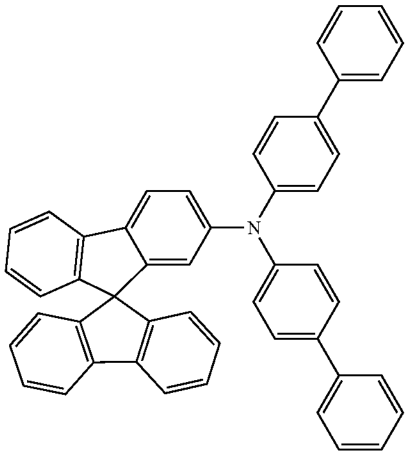

-continued
HT38
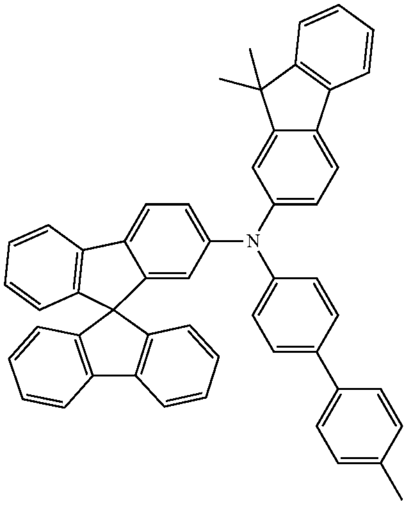
HT39
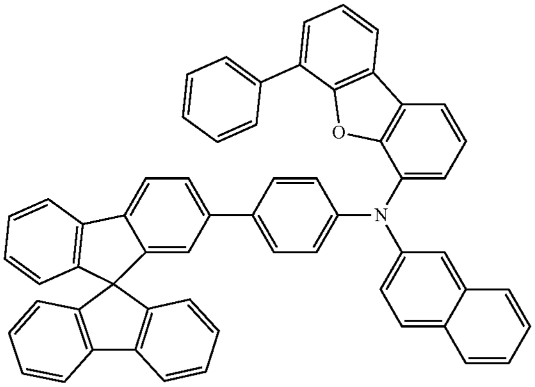
HT40
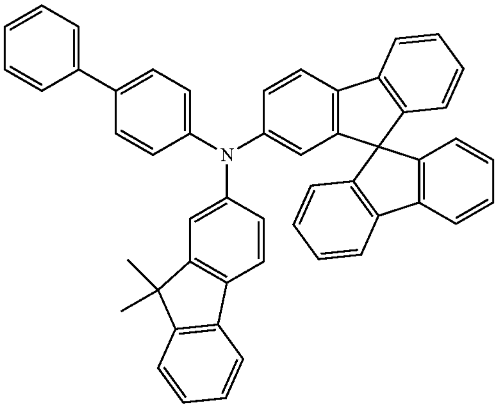
HT41
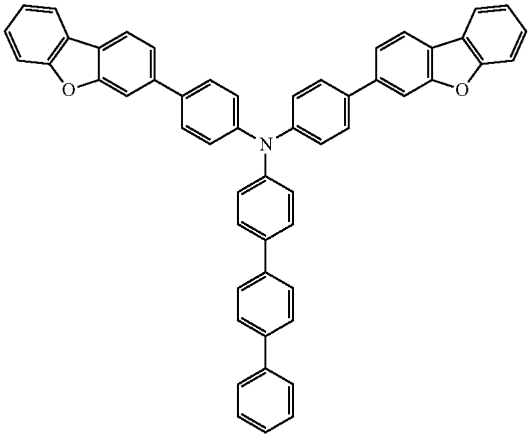
HT42
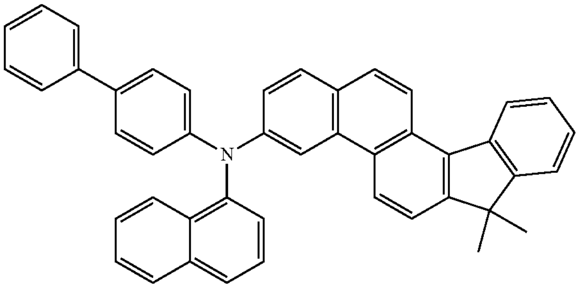
HT43
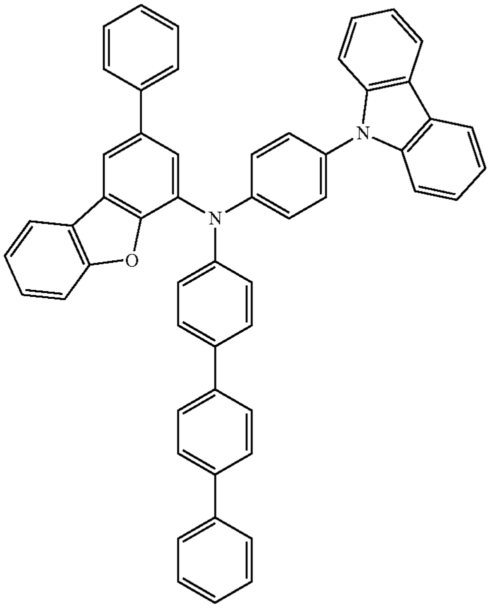

-continued
HT44
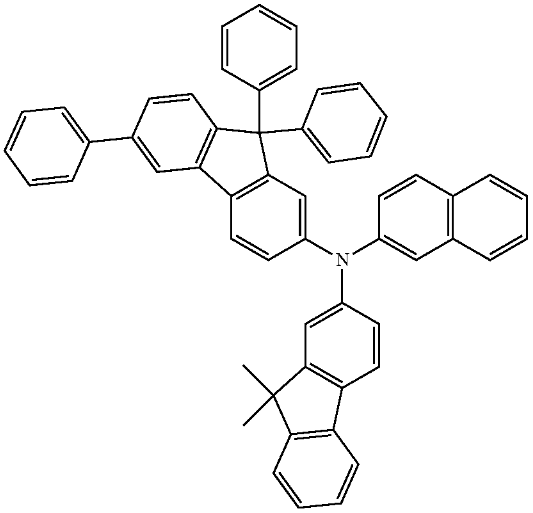
HT45
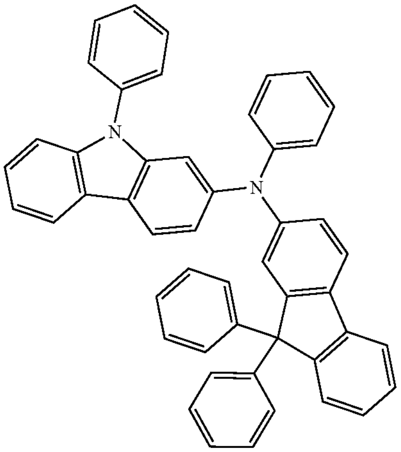
HT46
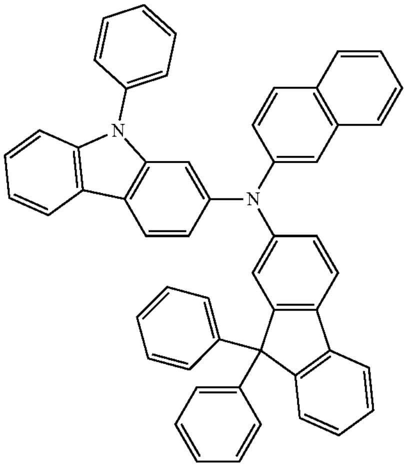
m-MTDATA
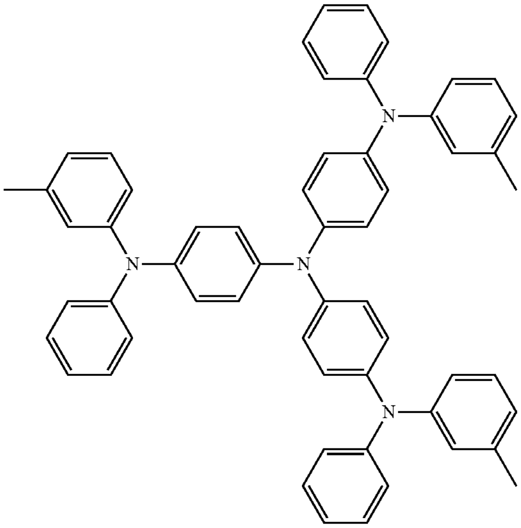
TDATA
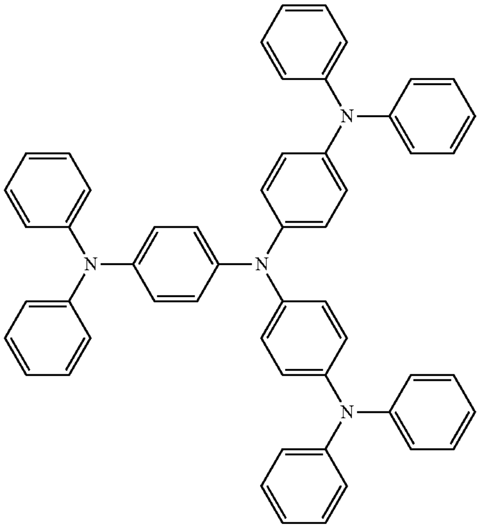
2-TNATA
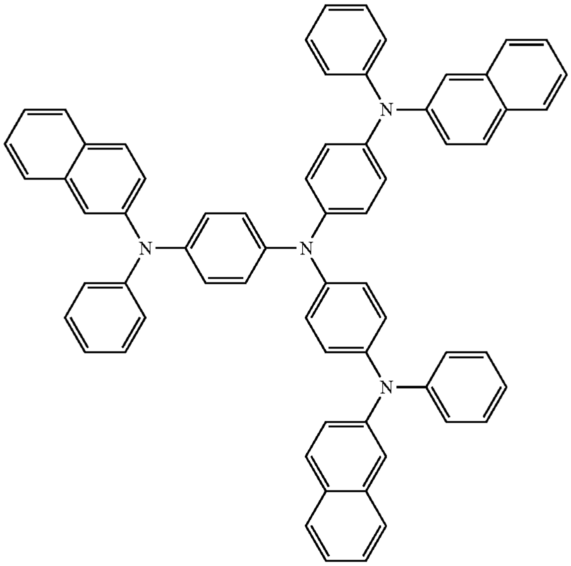

-continued

NPB

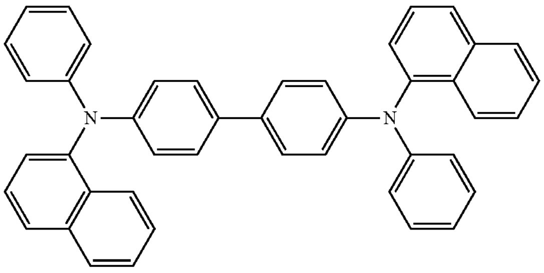

β-NPB

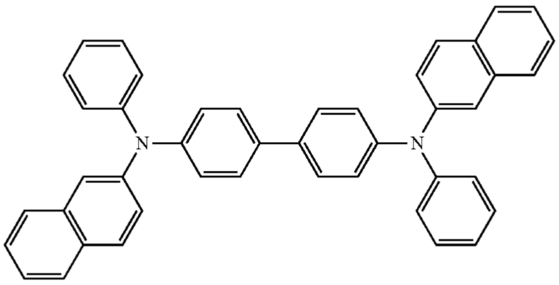

TPD

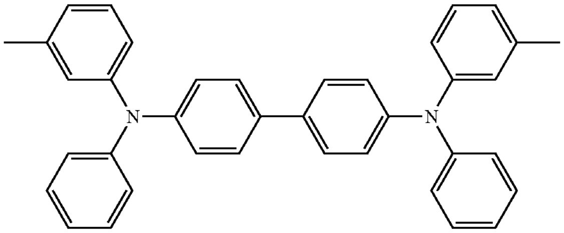

Spiro-TPD

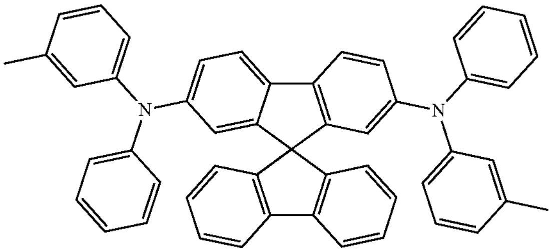

Spiro-NPB

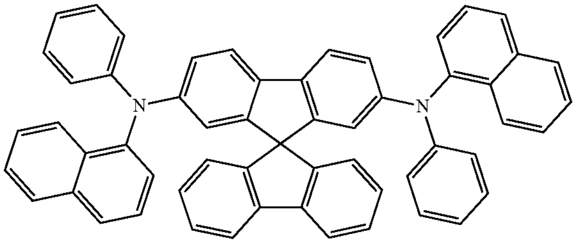

methylated-NPB

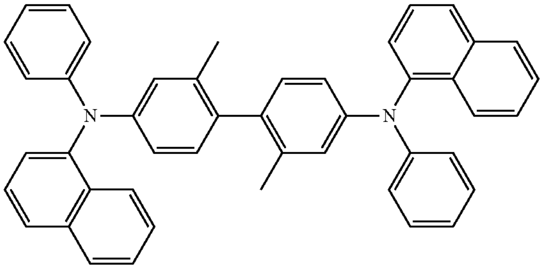

TAPC

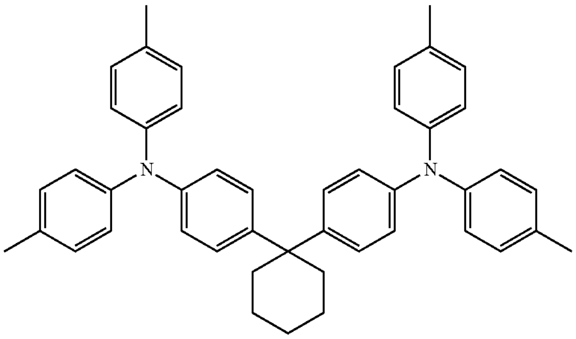

HMTPD

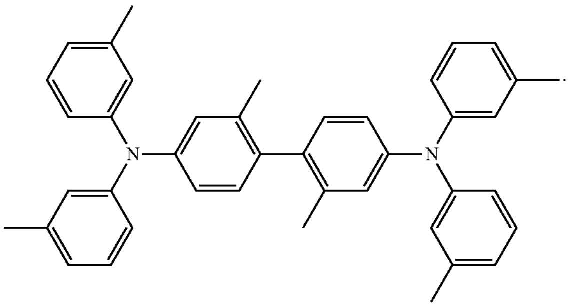

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole-transporting characteristics may be obtained without a substantial increase in driving voltage.

The auxiliary layer may compensate for an optical resonance distance according to a wavelength of light introduced to the activation layer 140 to increase light introduction efficiency. Also, the auxiliary layer may lower an energy barrier of holes in a direction of the hole transport layer and the anode to facilitate migration of holes. The electron blocking layer may prevent or reduce leakage of electrons from the activation layer 140 into the hole transport region. The hole transporting material may be included in the auxiliary layer and the electron blocking layer.

Electron Transport Region

The charge auxiliary layers between the activation layer 140 and the second electrode 170 may be collectively referred to as an electron transport region.

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, the electron transport layer 150, the electron injection layer 160, or any combination thereof.

In an embodiment, the electron transport region may have an electron transport layer/electron injection layer structure, a hole blocking layer/electron transport layer/electron injection layer structure, or a buffer layer/electron transport layer/electron injection layer structure, wherein the constituent layers of each structure are stacked sequentially from the activation layer 140.

The electron transport region (e.g., a buffer layer, a hole blocking layer, and/or an electron transport layer in the electron transport region) may include a metal-free compound including at least one 7 electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xe11 may be 1, 2, or 3, xe1 may be 0, 1, 2, 3, 4, or 5, $R_{601}$ may be $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are respectively the same as described in connection with $Q_1$ in the present specification, xe21 may be 1, 2, 3, 4, or 5, and at least one selected from $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

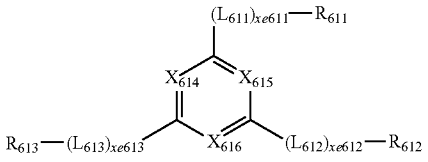

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ are respectively the same as those described in connection with $L_{601}$, xe611 to xe613 are respectively the same as those described in connection with xe1

$R_{611}$ to $R_{613}$ are respectively the same as those described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one selected from Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

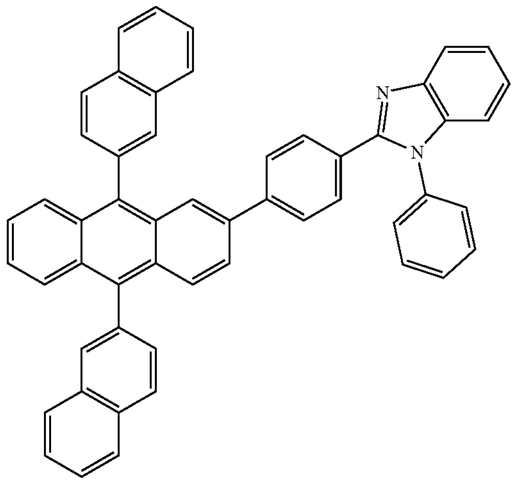

ET2

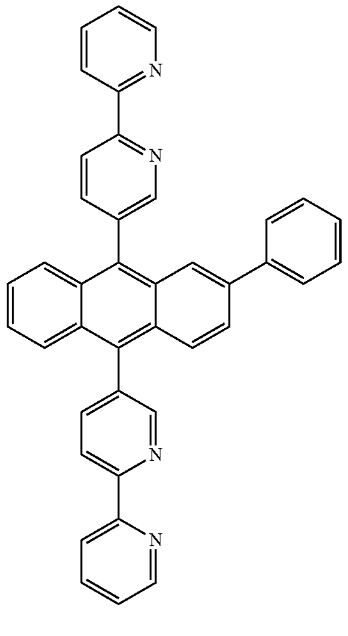

-continued
ET3
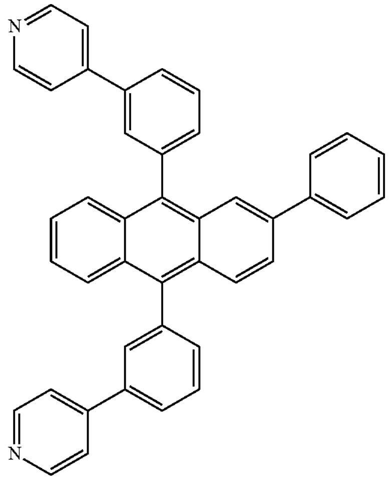
ET4
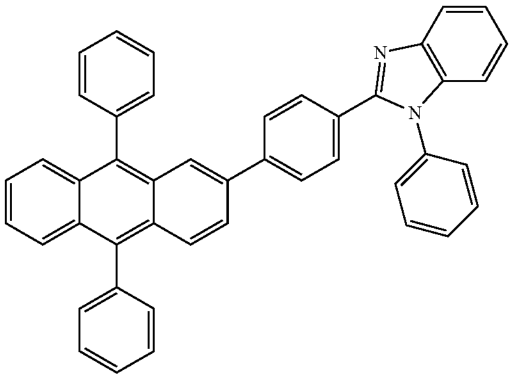
ET5
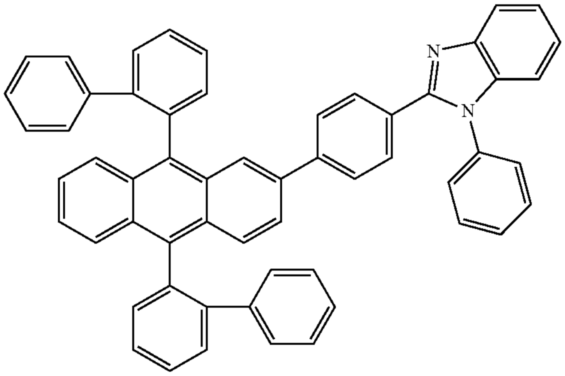
-continued
ET6
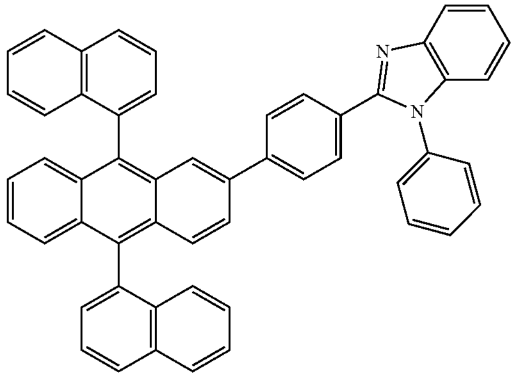
ET7
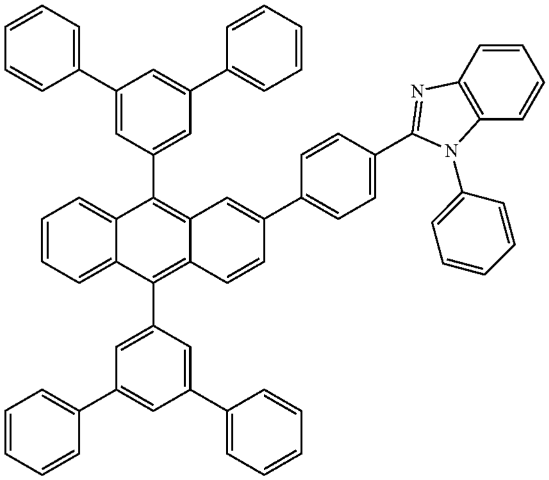
ET8
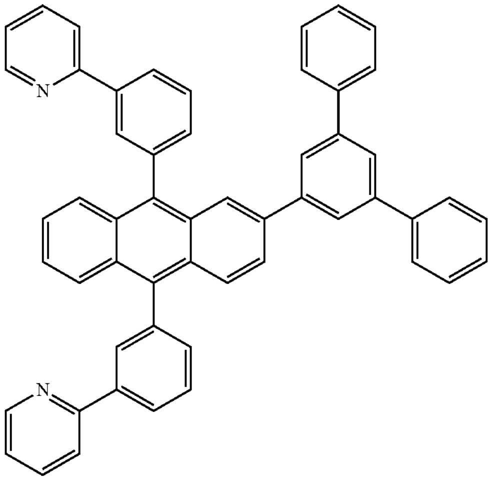

-continued
ET9
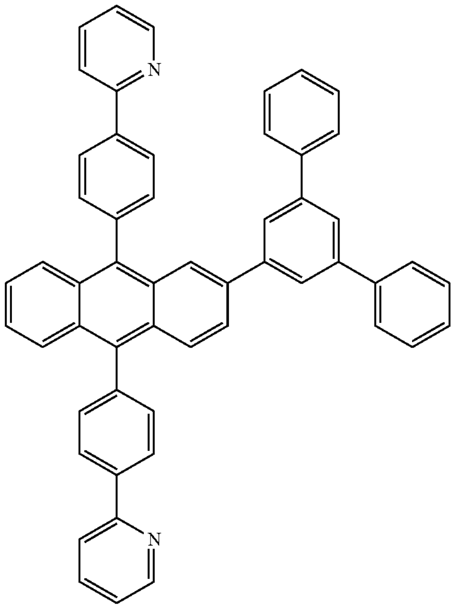
ET10
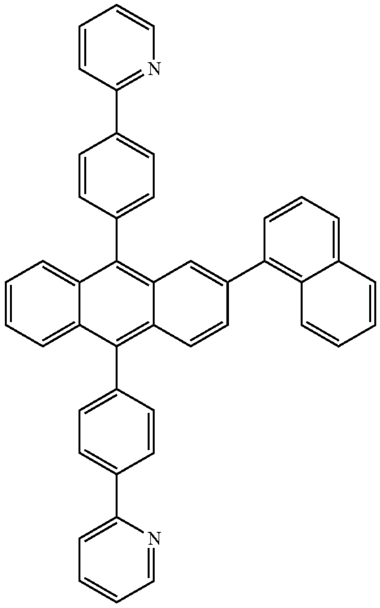
-continued
ET11
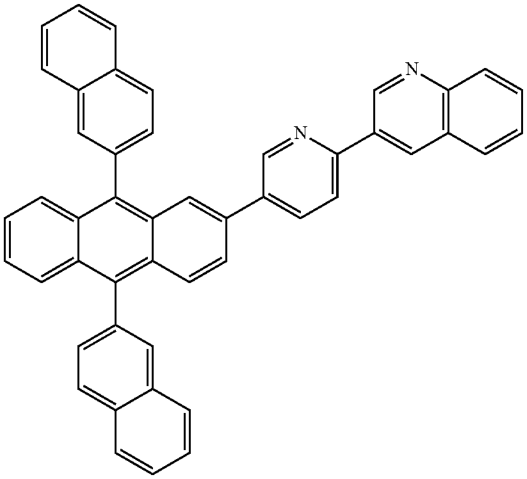
ET12
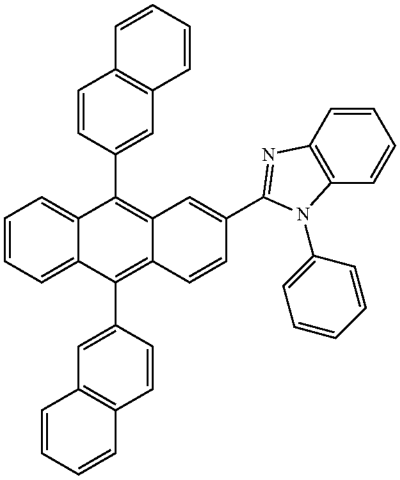
ET13
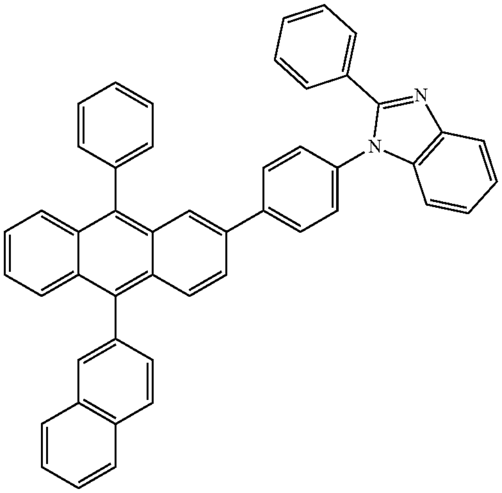

-continued
ET14
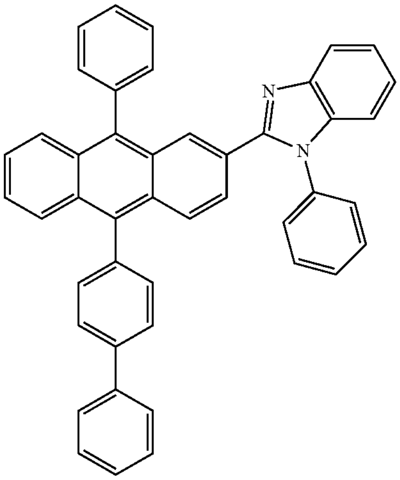
ET15
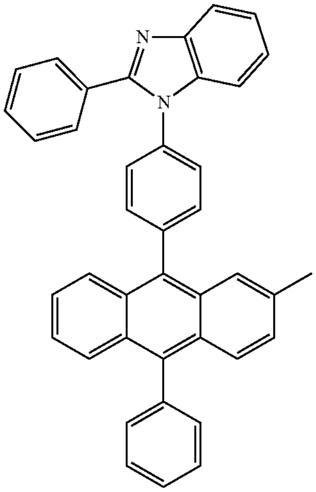
ET16
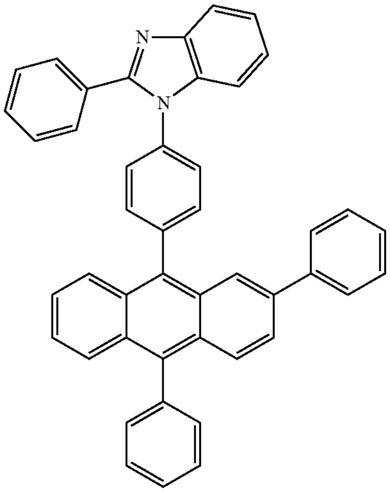
-continued
ET17
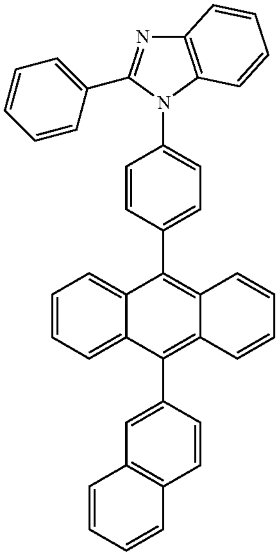
ET18
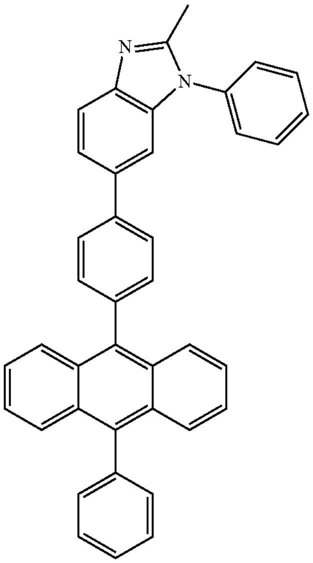
ET19
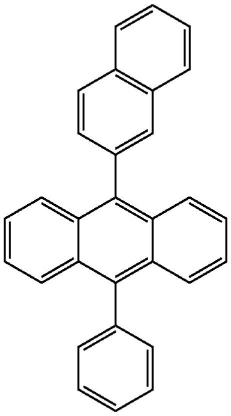

-continued
ET20
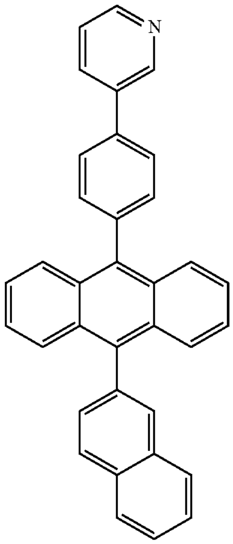
ET21
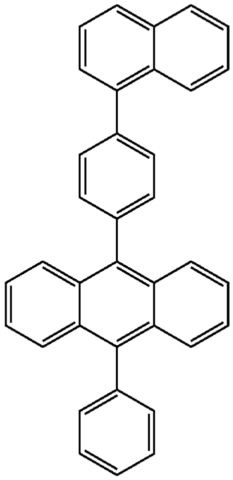
ET22
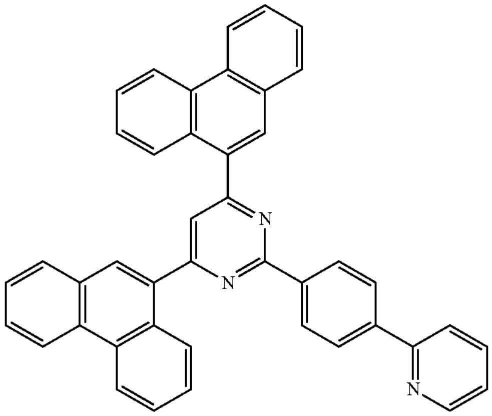
-continued
ET23
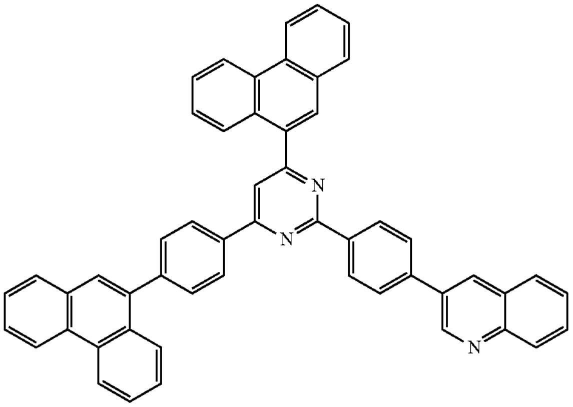
ET24
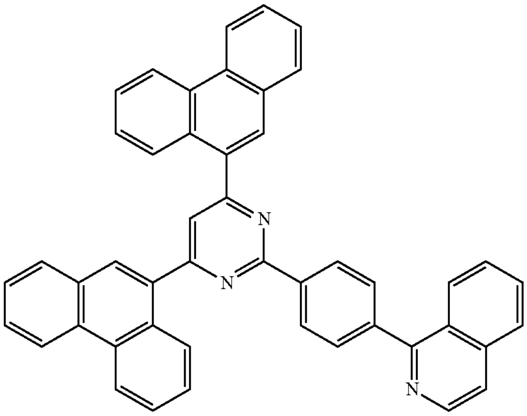
ET25
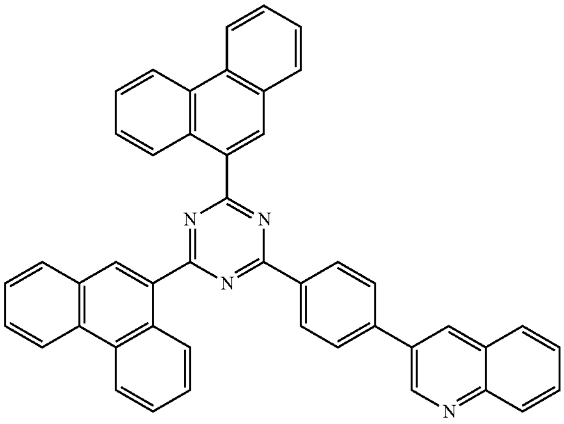

-continued
ET26
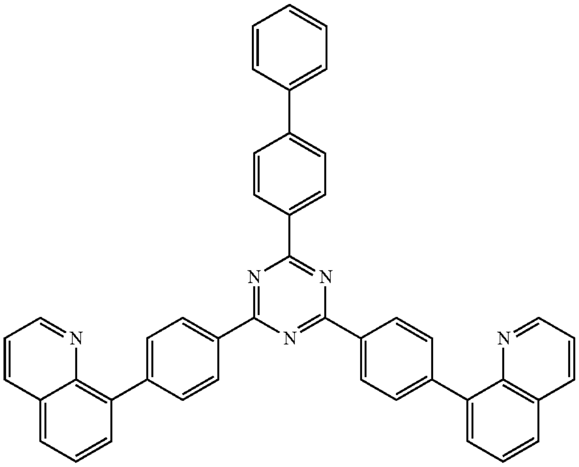
ET27
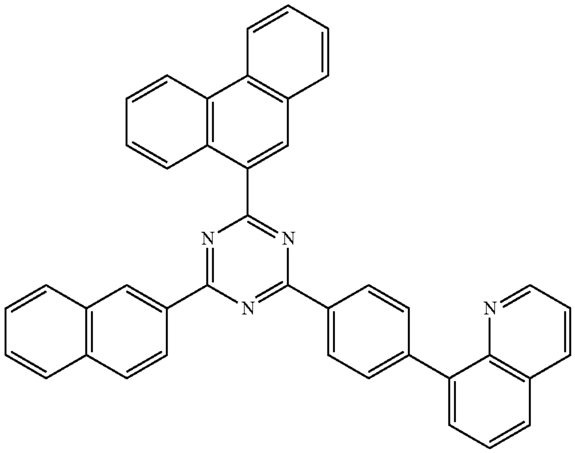
ET28
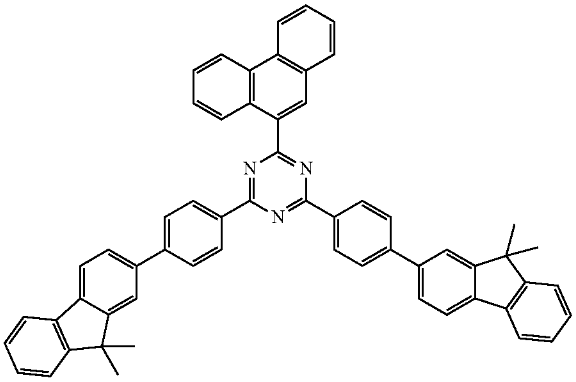
-continued
ET29
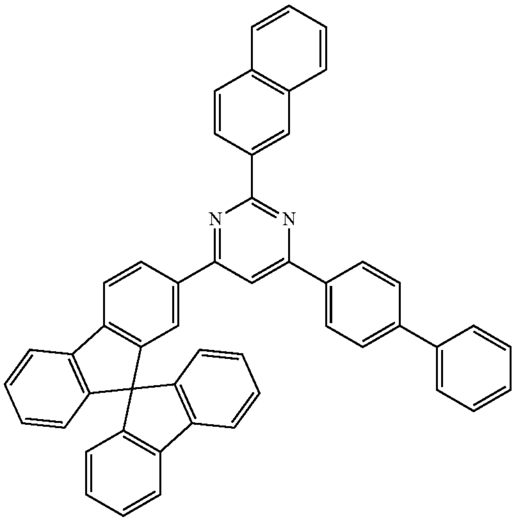
ET30
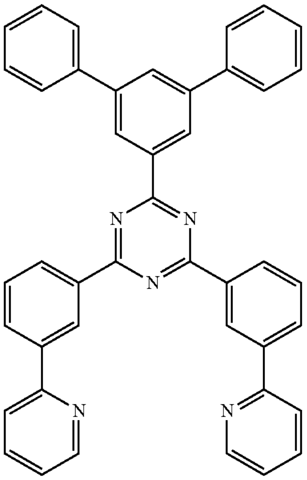
ET31
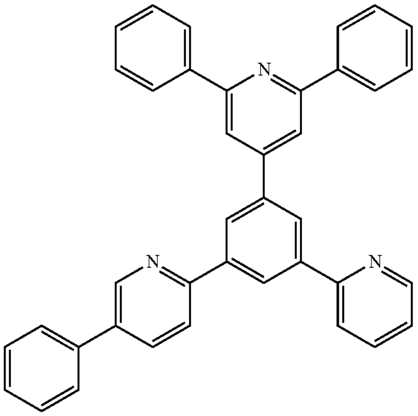

-continued
ET32
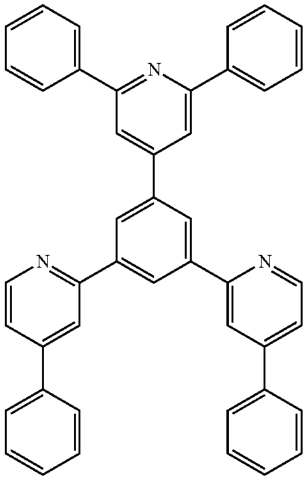
ET33
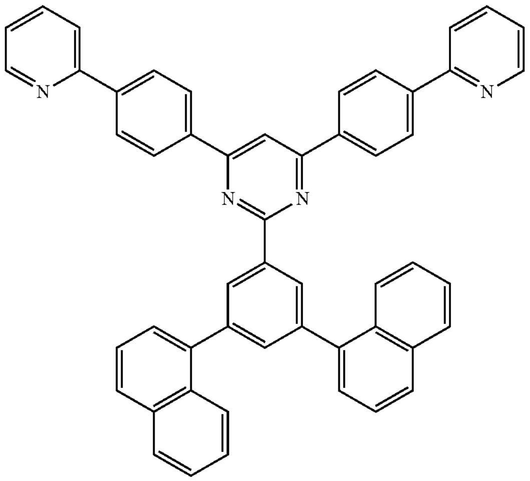
ET34
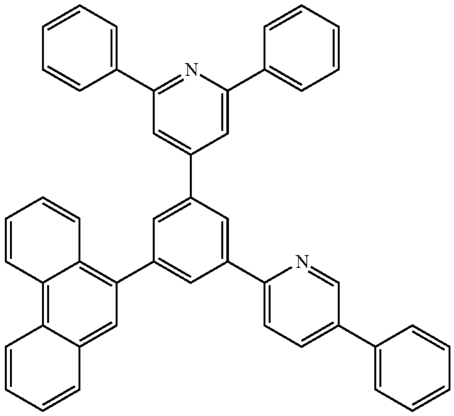
-continued
ET35
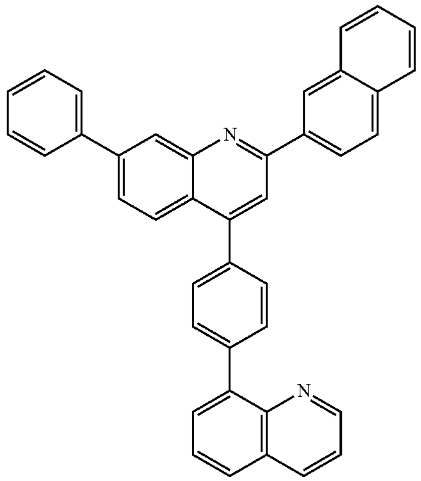
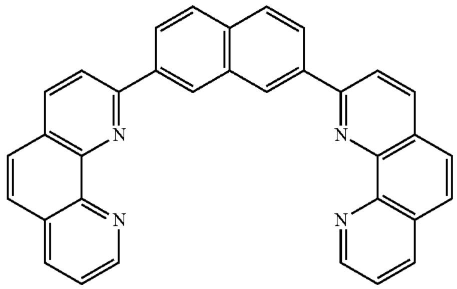
ET37
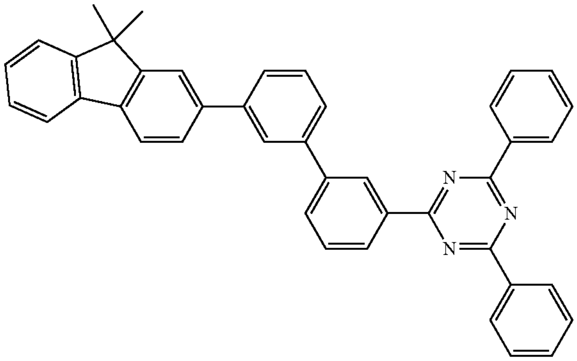
ET38
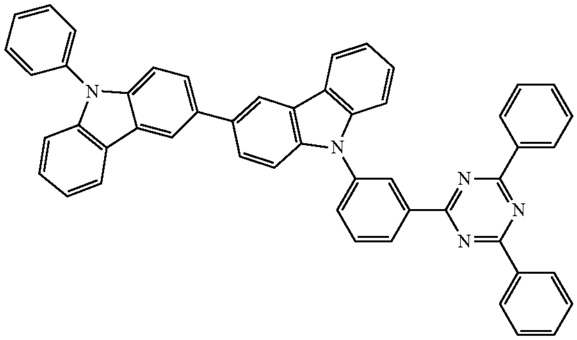

-continued
ET39
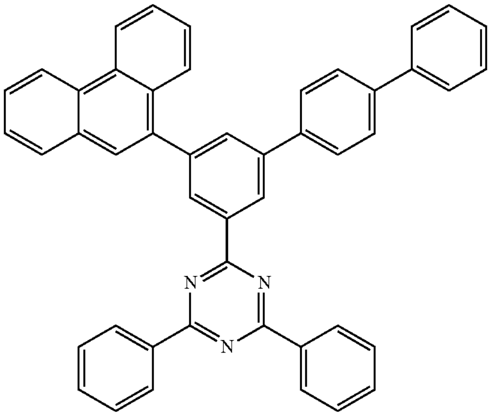
ET40
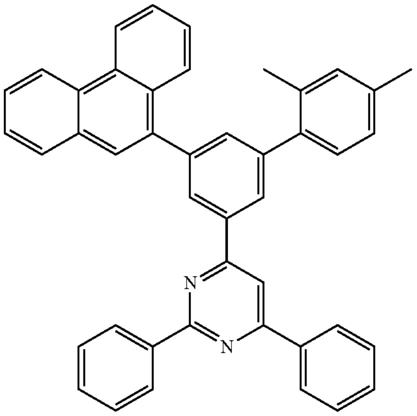
ET41
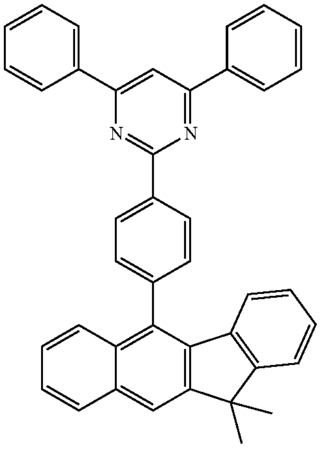
-continued
ET42
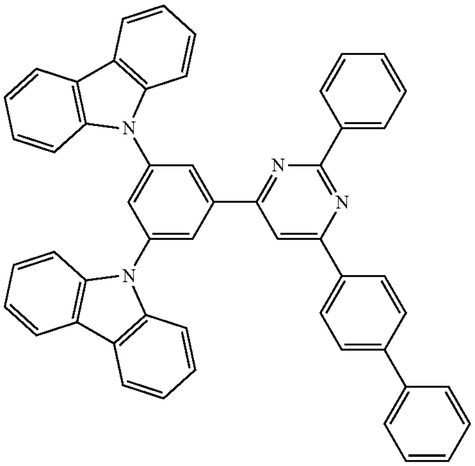
ET43
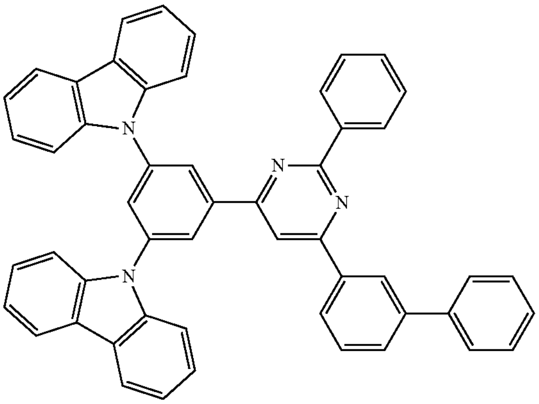
ET44
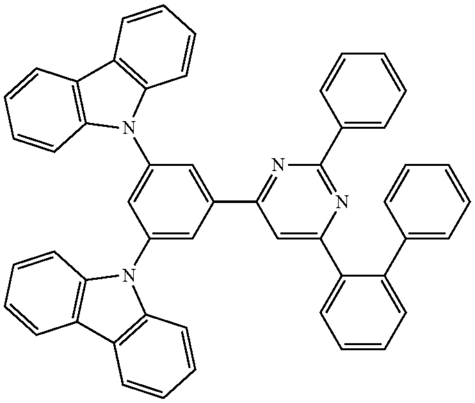
ET45
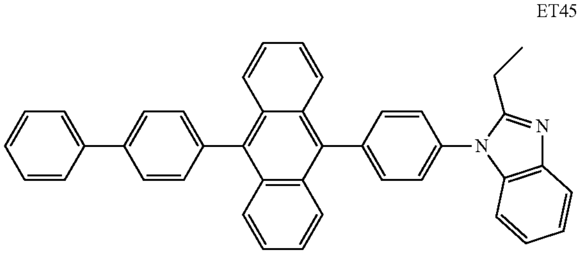

-continued

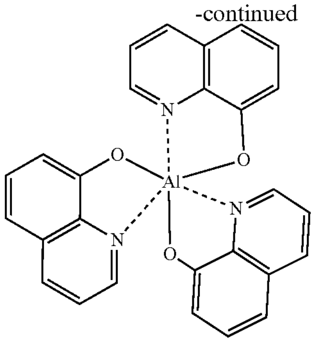

Alq3

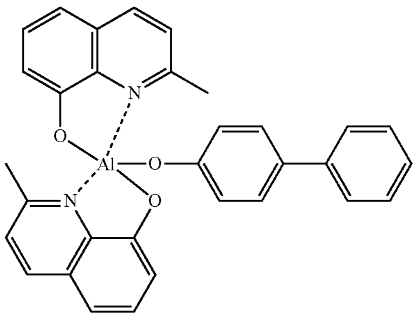

BAlq

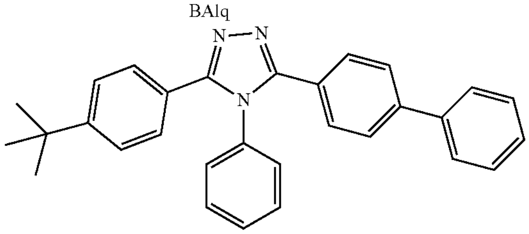

TAZ

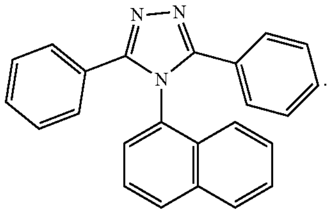

NTAZ

A thickness of the hole transport region may be in a range of about 50 Å to about 5,000 Å, for example, about 100 Å to about 4,000 Å. When the electron transport region includes a buffer layer, a hole blocking layer, an electron transport layer, or any combination thereof, the thicknesses of the buffer layer and the hole blocking layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, and/or the electron transport layer are within any of these ranges, excellent electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) and/or ET-D2:

ET-D1

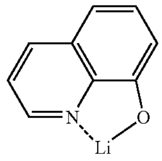

ET-D2

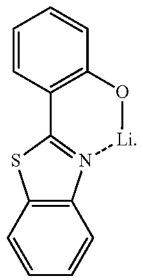

The electron transport region may include an electron injection layer that facilitates electron injection. The electron injection layer may be in direct contact (e.g., physical contact) with the second electrode 170.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, and/or iodides), and/or tellurides of the alkali metal, the alkaline earth metal, and the rare earth metal, or any combination thereof.

The alkali metal-containing compound may include alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one selected from ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, suitable or satisfactory electron injection characteristics may be obtained without a substantial increase in driving voltage.

Second Electrode 170

The second electrode 170 may be over the activation layer 140 or the electron transport region as described above. The second electrode 170 may be a cathode, and as the material for the second electrode 170, a metal, an alloy, an electrically conductive compound, or any combination thereof, each having a low work function, may be used.

The second electrode 170 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 170 may be a transmissive electrode, a semi-transmissive electrode, or a reflective electrode.

The second electrode 170 may have a single-layered structure or a multi-layered structure including a plurality of layers.

Capping Layer

A first capping layer may be outside the first electrode 110, and/or a second capping layer may be outside the second electrode 170.

The first capping layer and/or second capping layer prevents or reduces entrance of impurities such as water, oxygen, and/or the like into the organic photodetector 10, thereby improving reliability of the organic photodetector 10.

Each of the first capping layer and second capping layer may include a material having a refractive index (at a wavelength of 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one selected from the first capping layer and the second capping layer may each independently include an amine group-containing compound.

In an embodiment, at least one selected from the first capping layer and the second capping layer may each independently include a compound represented by Formula 201, a compound represented by Formula 202, or any combination thereof.

In an embodiment, at least one selected from the first capping layer and the second capping layer may each independently include one selected from Compounds HT28 to HT33, one selected from Compounds CP1 to CP6, β-NPB, or any combination thereof:

CP1

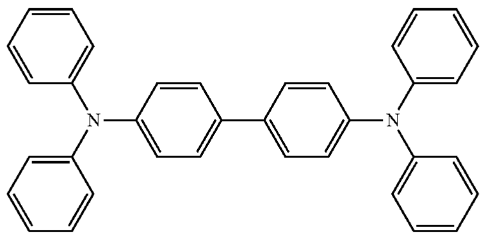

-continued

CP2

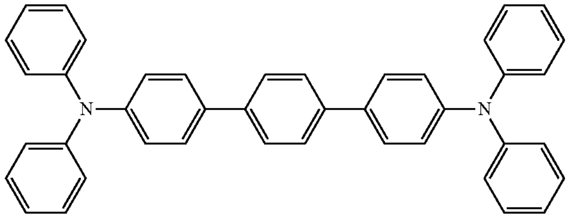

CP3

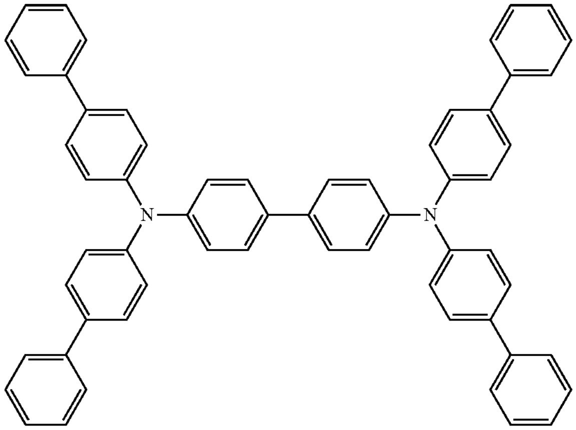

CP4

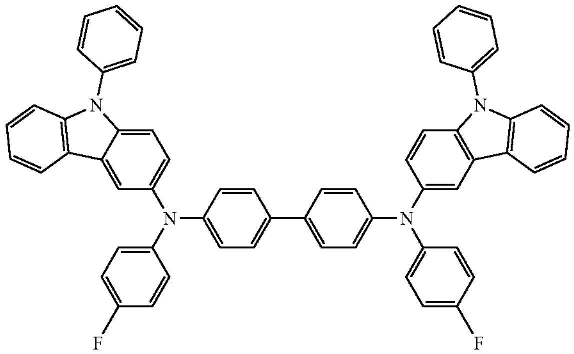

CP5

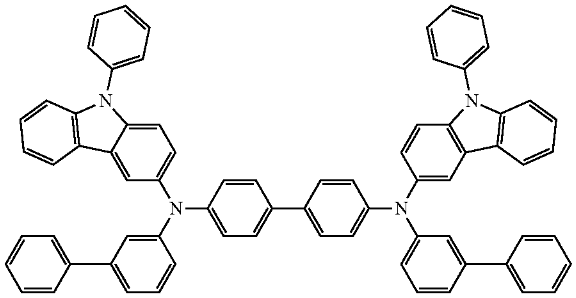

-continued

CP6

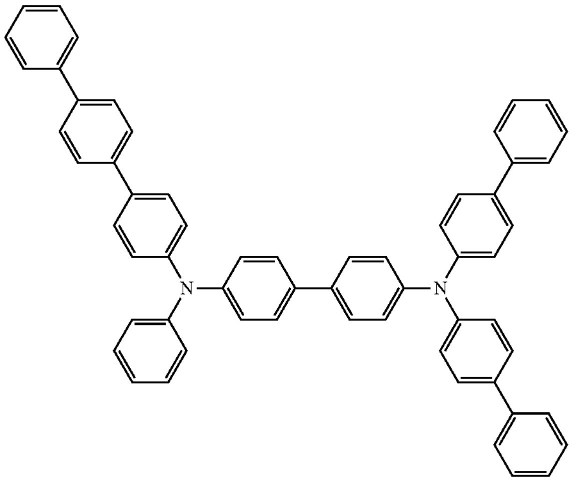

β-NPB

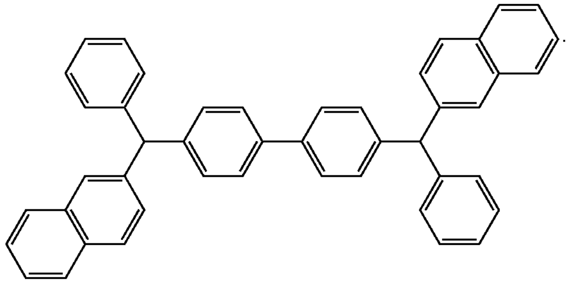

.

Electronic Apparatus

Provided is an electronic apparatus including the organic photodetector as described above. In an embodiment, the electronic apparatus may further include a light-emitting device.

Accordingly, the electronic apparatus according to an embodiment includes: a substrate including a light detection region and an emission region;

an organic photodetector on the light detection region; and a light-emitting device on the emission region, wherein the organic photodetector includes: a first pixel electrode; a counter electrode facing the first pixel electrode; and a hole transport region, an activation layer, and an electron transport region, which are sequentially between the first pixel electrode and the counter electrode, the light-emitting device includes: a second pixel electrode; the counter electrode facing the second pixel electrode; and the hole transport region, an emission layer, and the electron transport region, which are sequentially between the second pixel electrode and the counter electrode, the first pixel electrode and the activation layer are arranged in correspondence with the light detection region, the second pixel electrode and the emission layer are arranged in correspondence with the emission region, the hole transport region, the electron transport region, and the counter electrode are arranged throughout the light detection region and the emission region, and the activation layer may include a compound represented by Formula 1.

The hole transport region and the electron transport region are respectively the same as described above.

In an embodiment, the hole injection layer, the hole transport layer, the electron transport layer, and/or the electron injection layer; and the counter electrode may be arranged throughout the light detection region and the emission region.

The electronic apparatus may be applied to various suitable displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
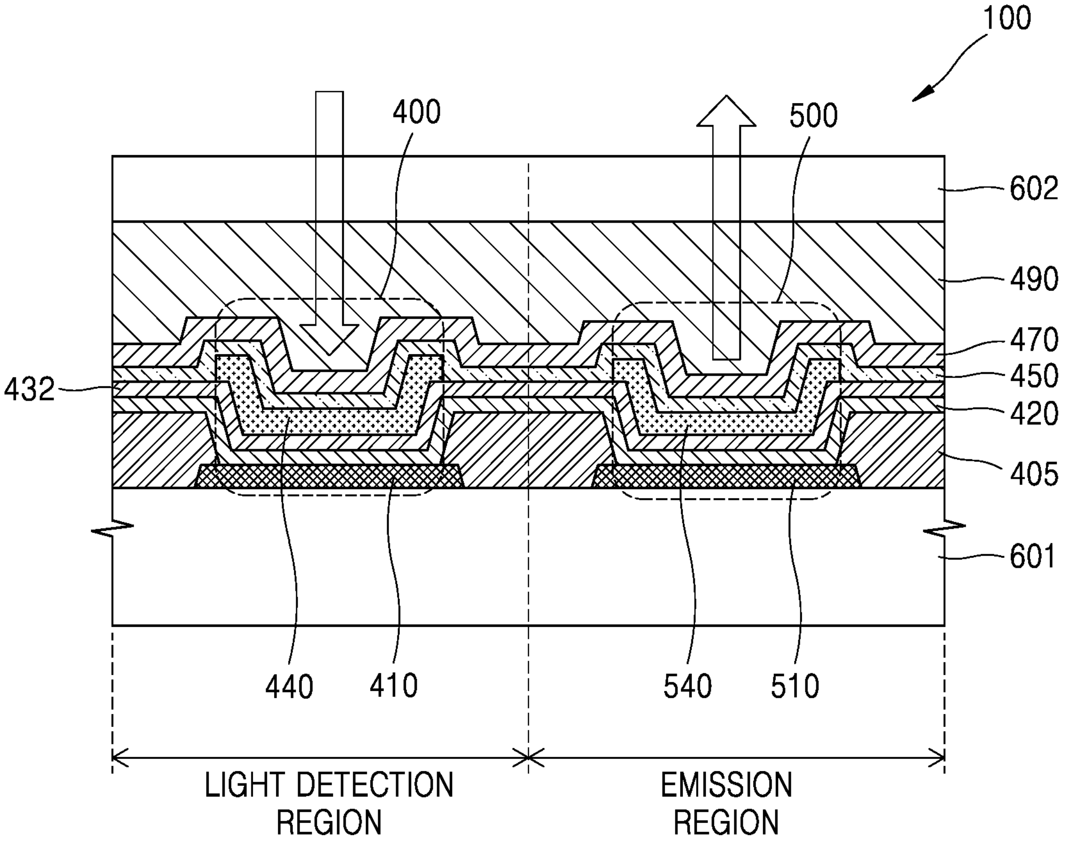
FIGS. 2 and 3 are each a schematic view of a structure of an electronic apparatus according to an embodiment.
Figure 3:
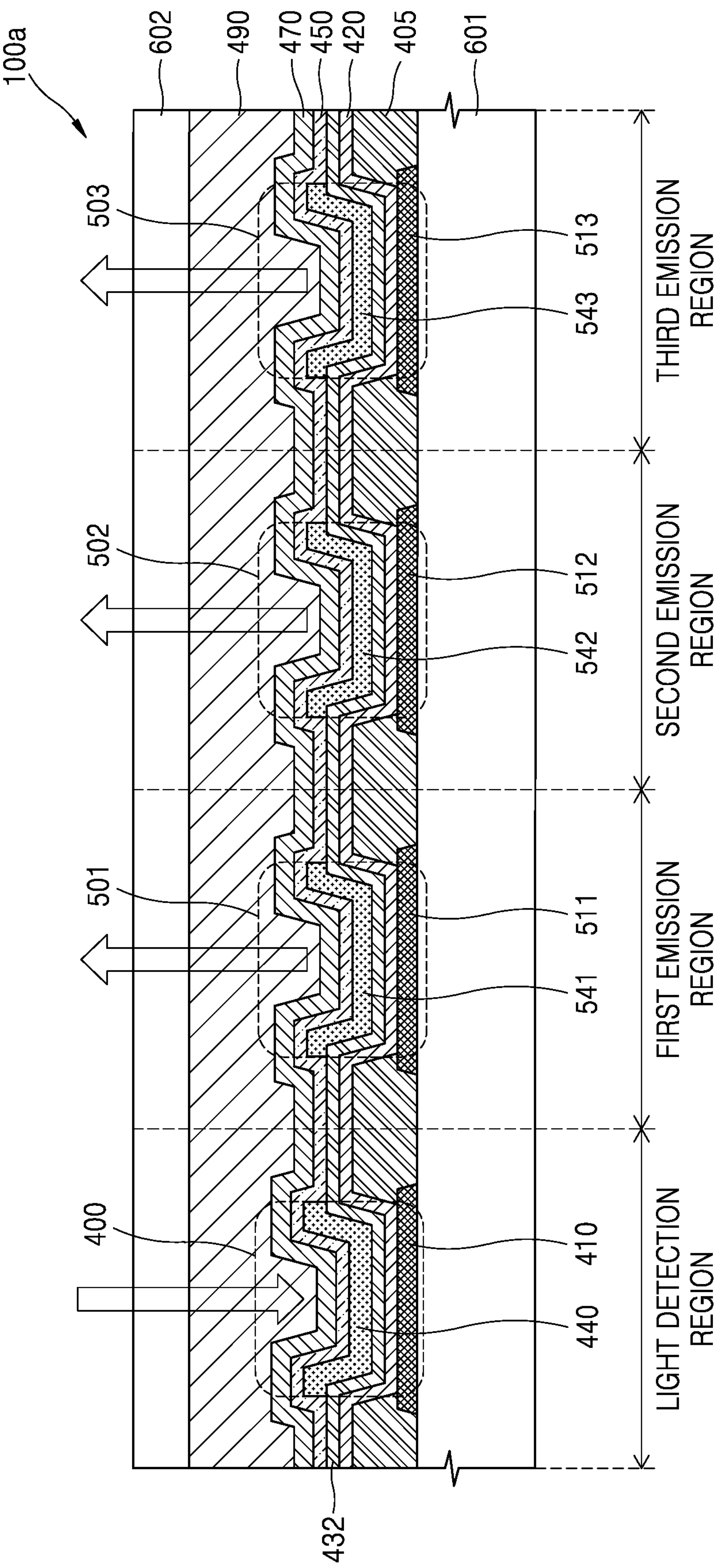

Description of FIGS. 2 and 3

FIG. 2 is a schematic cross-sectional view of an electronic apparatus 100 according to an embodiment.

Referring to FIG. 2, the electronic apparatus 100 may include an organic photodetector 400 and a light-emitting device 500 between a substrate 601 and a substrate 602.

The substrate 601 and the substrate 602 may be a flexible substrate, a glass substrate, and/or a metal substrate. A buffer layer and a thin-film transistor may be on the substrate 601.

The buffer layer may prevent or reduce penetration of impurities through the substrate 601 and provide a flat surface on the substrate 601. The thin-film transistor may be on the buffer layer and may include an activation layer, a gate electrode, a source electrode, and a drain electrode.

Such a thin-film transistor may be electrically connected to the light-emitting device 500 to drive the light-emitting device 500. One selected from the source electrode and drain electrode may be electrically connected to a second pixel electrode 510 of the light-emitting device 500.

Another thin-film transistor may be electrically connected to the organic photodetector 400. One selected from the source electrode and drain electrode may be electrically connected to a first pixel electrode 410 of the organic photodetector 400.

The organic photodetector 400 may include the first pixel electrode 410, a hole injection layer 420, a hole transport layer 432, an activation layer 440, an electron transport layer 450, and a counter electrode 470.

In an embodiment, the first pixel electrode 410 may be an anode, and the counter electrode 470 may be a cathode. For example, as the organic photodetector 400 is driven by applying a reverse bias across the first pixel electrode 410 and the counter electrode 470, the electronic apparatus 100 may detect light incident onto the organic photodetector 400, generate charges, and extract the charges as a current.

The light-emitting device 500 may include the second pixel electrode 510, the hole injection layer 420, the hole transport layer 432, an emission layer 540, an electron transport layer 450, and the counter electrode 470.

In an embodiment, the second pixel electrode 510 may be an anode, and the counter electrode 470 may be a cathode. For example, in the light-emitting device 500, holes injected from the second pixel electrode 510 and electrons injected from the counter electrode 470 recombine in the emission layer 540 to generate excitons, which generate light by changing from an excited state to a ground state.

The first pixel electrode 410 and the second pixel electrode 510 are respectively the same as described in connection with the first electrode 110 in the present specification.

A pixel-defining film 405 may be on an edge of the first pixel electrode 410 and on an edge of the second pixel electrode 510. The pixel-defining film 405 may define a pixel region and may electrically insulate between the first pixel electrode 410 and the second pixel electrode 510. The pixel-defining film 405 may include, for example, one or more various suitable organic insulating materials (e.g., a silicon-based material), inorganic insulating materials, and/or organic/inorganic composite insulating materials. The pixel-defining film 405 may be a transmissive film that may transmit visible light or a blocking film that may block or reduce transmission of visible light.

The hole injection layer 420 and the hole transport layer 432, which are common layers, are sequentially on the first pixel electrode 410 and the second pixel electrode 510. The hole injection layer 420 and the hole transport layer 432 are respectively the same as described in the present specification.

The activation layer 440 is on the hole transport layer 432 to correspond to the light detection region. The activation layer 440 is the same as described in the present specification.

The emission layer 540 is on the hole transport layer 432 to correspond to the emission region. The emission layer 540 is the same as described in the present specification. In an embodiment, the light-emitting device 500 may further include, between the second pixel electrode 510 and the emission layer 540, an electron blocking layer arranged in correspondence with the emission region.

As common layers for the entirety of the light detection region and the emission region, the electron transport layer 450 and the counter electrode 470 are sequentially on the activation layer 440 and the emission layer 540. The electron transport layer 450 and the counter electrode 470 are respectively the same as described in connection with the electron transport layer and the second electrode 170 in the present specification.

The hole injection layer 420, the hole transport layer 432, and the electron transport layer 450 may each be located throughout the light detection region and the emission region.

As such, in the electronic apparatus 100, by placing a common layer over the organic photodetector 400 and the light-emitting device 500, a manufacturing process may be reduced, and a functional layer material used in the light-emitting device 500 may also be used in the organic photodetector 400. Thus, the organic photodetector 400 may be in a pixel of the electronic apparatus.

In an embodiment, an electron injection layer may be further included in the electron transport layer 450 and the counter electrode 470.

A capping layer may be on the counter electrode 470. A material for forming the capping layer may include the organic material and/or the inorganic material described herein. The capping layer may serve to protect the organic photodetector 400 and the light-emitting device 500 and to assist effective light emission from the light-emitting device 500.

An encapsulation portion 490 may be on the capping layer. The encapsulation portion 490 may be on the organic photodetector 400 and the light-emitting device 500 to thereby protect the organic photodetector 400 and the light-emitting device 500 from water and/or oxygen. The encapsulation portion 490 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxy methylene, poly aryllate, hexamethyl disiloxane, an acrylic resin (e.g., polymethyl methacrylate, polyacrylic acid, and/or the like), an epoxy resin (e.g., aliphatic glycidyl ether (AGE) and/or the like), or any combination thereof; or a combination of the inorganic film and the organic film.

The electronic apparatus 100 may be, for example, a display apparatus. The electronic apparatus 100 includes both the organic photodetector 400 and the light-emitting device 500, and thus, may be a display apparatus with a light detection function.

In FIG. 2, the electronic apparatus 100 is illustrated as including one light-emitting device 500, but, as shown in FIG. 3, an electronic apparatus 100*a* according to an embodiment may include the organic photodetector 400, a first light-emitting device 501, a second light-emitting device 502, and a third light-emitting device 503.

Components illustrated in FIG. 3 may be understood by referring to the descriptions of the electronic apparatus 100.

The first light-emitting device 501 may include a second pixel electrode 511, the hole injection layer 420, the hole transport layer 432, a first emission layer 541, the electron transport layer 450, and the counter electrode 470.

The second light-emitting device 502 may include a third pixel electrode 512, the hole injection layer 420, the hole transport layer 432, a second emission layer 542, the electron transport layer 450, and the counter electrode 470.

The third light-emitting device 503 may include a fourth pixel electrode 513, the hole injection layer 420, the hole transport layer 432, a third emission layer 543, the electron transport layer 450, and the counter electrode 470.

The second pixel electrode 511, the third pixel electrode 512, and the fourth pixel electrode 513 may respectively correspond to a first emission region, a second emission region, and a third emission region, and may respectively be the same as described in connection with the first electrode 110 in the present specification.

The first emission layer 541 may be arranged in correspondence with the first emission region and emit first color light, the second emission layer 542 may be arranged in correspondence with the second emission region and emit second color light, and the third emission layer 543 may be arranged in correspondence with the third emission region and emit third color light.

A maximum emission wavelength of the first color light, a maximum emission wavelength of the second color light, and a maximum emission wavelength of the third color light may be identical to or different from each other. In an embodiment, a maximum emission wavelength of the first color light and a maximum emission wavelength of the second color light may each be longer than a maximum emission wavelength of the third color light.

In an embodiment, the first color light may be red light, the second color light may be green light, and the third color light may be blue light, but embodiments are not limited thereto. Thus, the electronic apparatus 100*a* may be capable of full color emission. When a mixed light of the first color light, the second color light, and the third color light is white light, the first color light, the second color light, and the third color light may not be respectively limited to red light, green light, and blue light.

The organic photodetector 400, the first light-emitting device 501, the second light-emitting device 502, and the third light-emitting device 503 may each be a sub-pixel, each forming a pixel. In an embodiment, one pixel may include at least one organic photodetector 400.

The electronic apparatus 100*a* may be a display apparatus. As the electronic apparatus 100*a* may include the organic photodetector 400, the first light-emitting device 501, the second light-emitting device 502, and the third light-emitting device 503, the electronic apparatus 100*a* may be a full-color display apparatus having a light detection function.

Figure 4A:
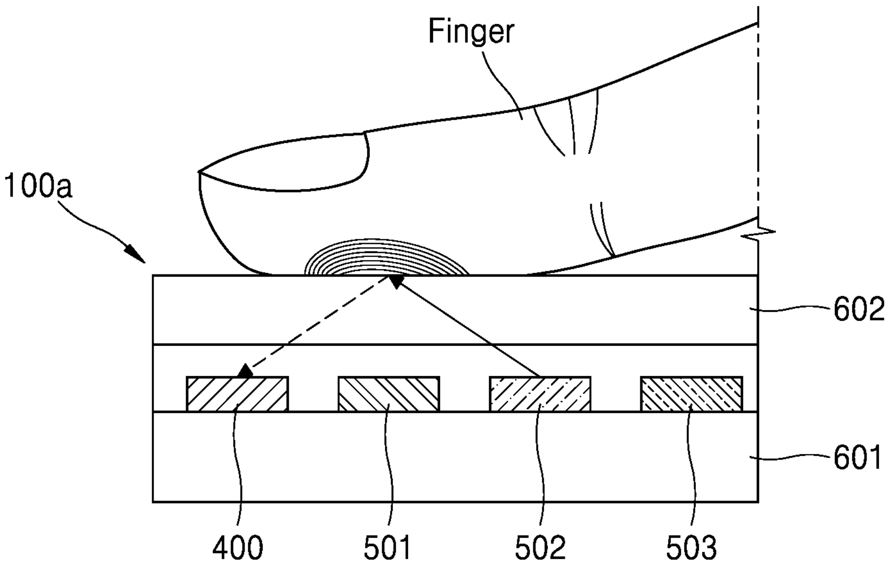
FIGS. 4A and 4B are each a view of an example of an electronic apparatus according to an embodiment.
Figure 4B:
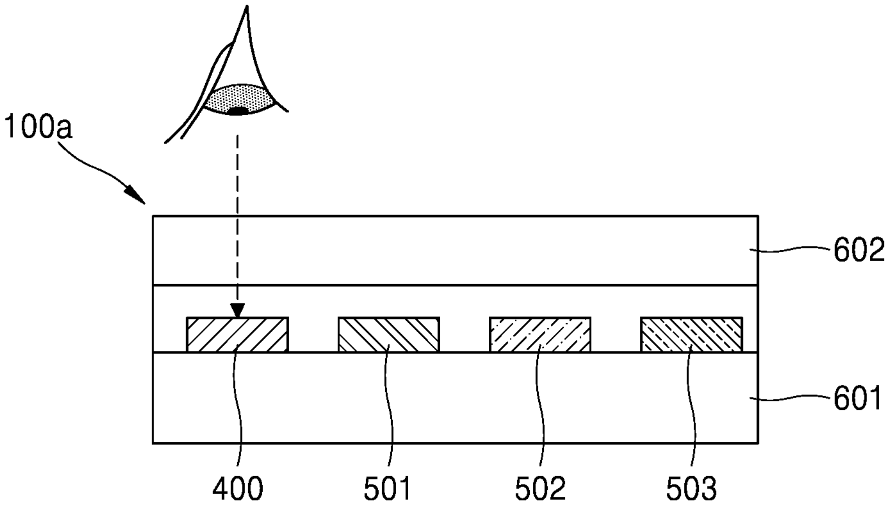

Descriptions of FIGS. 4A and 4B

In the electronic apparatus 100*a* shown in FIG. 4A, the organic photodetector 400 and the light-emitting devices 501, 502, and 503 may be between the substrate 601 and the substrate 602.

In an embodiment, red light, green light, and blue light may respectively be emitted from the first light-emitting device 501, the second light-emitting device 502, and the third light-emitting device 503.

The electronic apparatus 100*a* according to an embodiment may have a function of detecting an object being in contact (e.g., physical contact) with the electronic apparatus 100*a*, for example, a fingerprint of a finger. In an embodiment, as shown in FIG. 4A, at least some light emitted from the light-emitting device 502 and reflected by a fingerprint of a user may be re-incident on the organic photodetector 400, and thus, the organic photodetector 400 may detect the reflected light. A ridge in a fingerprint pattern of a finger may adhere to the substrate 602, and thus, the organic photodetector 400 may selectively obtain the fingerprint pattern of a user, for example, image information of ridges of the fingerprint pattern. Although FIG. 4A shows an example in which information of an object being in contact (e.g., physical contact) with the electronic apparatus 100*a* is obtained by using light emitted from the second light-emitting device 502, light emitted from the first light-emitting device 501 and/or light emitted from the third light-emitting device 503 may also be used in substantially the same manner when obtaining information by using emitted light.

In an embodiment, as shown in FIG. 4B, the electronic apparatus 100*a* according to an embodiment may detect an object that is not in contact (e.g., physical contact) with the electronic apparatus 100*a*.

Manufacturing Method

The layers constituting the hole transport region, the activation layer, and the layers constituting the electron transport region may be formed in a set or specific region by using one or more suitable methods such as vacuum deposition, spin coating, casting, Langmuir-Blodgett (LB) deposition, ink-jet printing, laser printing, and/or laser-induced thermal imaging.

When layers constituting the hole transport region, an activation layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

DEFINITION OF TERMS

The term "$C_3$-$C_{60}$ carbocyclic group," as used herein, refers to a cyclic group consisting of carbon only as a ring-forming atom and having three to sixty carbon atoms, and the term "$C_1$-$C_{60}$ heterocyclic group," as used herein, refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed together with each other. In an embodiment, the $C_1$-$C_{60}$ heterocyclic group has 3 to 61 ring-forming atoms.

The term "cyclic group," as used herein, may include the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group that has three to sixty carbon atoms and does not include *—N=*' as a ring-forming moiety, and the term "π electron-deficient nitrogen-containing $C_1$-$C_{60}$ cyclic group," as used herein, refers to a heterocyclic group that has one to sixty carbon atoms and includes *—N=*' as a ring-forming moiety.

In an embodiment, the $C_3$-$C_{60}$ carbocyclic group may be i) group T1 or ii) a condensed cyclic group in which two or more groups T1 are condensed together with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed together with each other, or iii) a condensed cyclic group in which at least one group T2 and at least one group T1 are condensed together with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed together with each other, iii) group T3, iv) a condensed cyclic group in which two or more groups T3 are condensed together with each other, or v) a condensed cyclic group in which at least one group T3 and at least one group T1 are condensed together with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed together with each other, iii) a condensed cyclic group in which at least one group T4 and at least one group T1 are condensed together with each other, iv) a condensed cyclic group in which at least one group T4 and at least one group T3 are condensed together with each other, or v) a condensed cyclic group in which at least one group T4, at least one group T1, and at least one group T3 are condensed together with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group," as used herein, refers to a group condensed to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

In an embodiment, Examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group," as used herein, refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of the $C_2$-$C_{60}$ alkyl group, and examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by $—OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group of 3 to 10 carbon atoms, and examples thereof include a cyclopropyl group, a cyclobutyl group, a cyclopentyl group, a cyclohexyl group, a cycloheptyl group, a cyclooctyl group, an adamantyl group, a norbornyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group that has three to ten carbon atoms and at least one carbon-carbon double bond in the ring thereof and no aromaticity (e.g., is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having six to sixty carbon atoms, and the term "$C_6$-$C_{60}$ arylene group," as used herein, refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed together with each other.

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed together with each other.

The term "monovalent non-aromatic condensed polycyclic group," as used herein, refers to a monovalent group having two or more rings condensed together with each other, only carbon atoms (for example, having 8 to 60 carbon atoms) as ring-forming atoms, and non-aromaticity in its molecular structure when considered as a whole (e.g., is not aromatic when considered as a whole). Examples of the monovalent non-aromatic condensed polycyclic group include an indenyl group, a fluorenyl group, a spiro-bifluorenyl group, a benzofluorenyl group, an indenophenanthrenyl group, and an indeno anthracenyl group. The term "divalent non-aromatic condensed polycyclic group," as used herein, refers to a divalent group having substantially the same structure as a monovalent non-aromatic condensed polycyclic group.

The term "monovalent non-aromatic condensed heteropolycyclic group," as used herein, refers to a monovalent group having two or more rings condensed together with each other, at least one heteroatom, in addition to carbon atoms (for example, including 1 to 60 carbon atoms), as a ring-forming atom, and non-aromaticity in its molecular structure when considered as a whole (e.g., is not aromatic when considered as a whole). Examples of the monovalent non-aromatic condensed heteropolycyclic group include a 9,9-dihydroacridinyl group and a 9H-xanthenyl group. The term "divalent non-aromatic condensed heteropolycyclic group," as used herein, refers to a divalent group having substantially the same structure as a monovalent non-aromatic condensed heteropolycyclic group.

The term "$C_6$-$C_{60}$ aryloxy group," as used herein, indicates —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "$C_7$-$C_{60}$ arylalkyl group," as used herein, refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group," as used herein, refers to -$A_{106}A_{107}$ (where $A_{106}$ may be a $C_1$-$C_{60}$ alkylene group, and $A_{107}$ may be a $C_1$-$C_{60}$ heteroaryl group).

$R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom," as used herein, refers to any atom other than a carbon atom. Examples of the heteroatom include O, S, N, P, Si, B, Ge, Se, or any combination thereof.

The term "the third-row transition metal," as used herein, includes hafnium (Hf), tantalum (Ta), tungsten (W), rhenium (Re), osmium (Os), iridium (Ir), platinum (Pt), gold (Au), and the like.

The term "Ph," as used herein, refers to a phenyl group, the term "Me," as used herein, refers to a methyl group, the term "Et," as used herein, refers to an ethyl group, the term "ter-Bu" or "But," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

EXAMPLES

Comparative Example 1

An ITO glass substrate (anode) was cut to a size of 50 mm×50 mm×0.5 mm, sonicated in isopropyl alcohol and pure water for 10 minutes in each solvent, and cleaned by irradiation of ultraviolet rays and exposure of ozone thereto for 10 minutes. Then, the glass substrate was mounted to a vacuum-deposition apparatus. HAT-CN was vacuum-deposited on the anode to form a hole injection layer having a thickness of 100 Å, and HT3 was vacuum-deposited on the hole injection layer to form a hole transport layer having a thickness of 1,250 Å.

m-MTDATA was vacuum-deposited on the hole transport layer to form an auxiliary layer having a thickness of 200 Å.

SubPC having a thickness of 200 Å and a $C_{60}$ fullerene having a thickness of 250 Å were sequentially deposited on the auxiliary layer to form an activation layer.

Next, BAlq was vacuum-deposited thereon to form a buffer layer having a thickness of 50 Å, and ET1 was vacuum-deposited on the buffer layer to form an electron transport layer having a thickness of 300 Å.

LiF was vacuum-deposited on the electron transport layer to form an electron injection layer having a thickness of 10 Å, and then MgAg having a thickness of 100 Å was sequentially deposited thereon to form a cathode, thereby completing manufacture of an organic photodetector.

Comparative Example 2

An organic photodetector was manufactured in substantially the same manner as in Comparative Example 1, except that, in forming the activation layer, Compound N,N'-dioctyl-3,4,9,10-perylenedicarboximide was used instead of the fullerene.

Comparative Example 3

An organic photodetector was manufactured in substantially the same manner as in Comparative Example 1, except that, in forming the activation layer, Compound N,N'-ditridecylperylene-3,4,9,10-tetracarboxylic diimide was used instead of the fullerene.

Example 1

An organic photodetector was manufactured in substantially the same manner as in Comparative Example 1, except that, in forming the activation layer, SubPC and Compound $A_{01}$ were co-deposited (at a weight ratio of 50:50) to form an activation layer having a thickness of 450 Å.

Example 2

An organic photodetector was manufactured in substantially the same manner as in Comparative Example 1, except that, in forming the activation layer, Compound A01 was used instead of the fullerene.

Example 3

An organic photodetector was manufactured in substantially the same manner as in Comparative Example 1, except that, in forming the activation layer, only Compound A10 was used to form an activation layer having a thickness of 450 Å.

Example 4

An organic photodetector was manufactured in substantially the same manner as in Comparative Example 1, except that, in forming the activation layer, SubPC was vacuum-deposited to a thickness of 100 Å, SubPC and Compound A14 were co-deposited (50:50) to a thickness of 250 Å, and then Compound A14 was sequentially vacuum-deposited to a thickness of 100 Å, to form an activation layer.

Example 5

An organic photodetector was manufactured in substantially the same manner as in Comparative Example 1, except that, in forming the activation layer, NPB and Compound A18 were co-deposited (50:50) to form an activation layer having a thickness of 450 Å.

Example 6

An organic photodetector was manufactured in substantially the same manner as in Comparative Example 1, except that, in forming the activation layer, TDATA and Compound A18 were co-deposited (50:50) to form an activation layer having a thickness of 450 Å.

Example 7

An organic photodetector was manufactured in substantially the same manner as in Comparative Example 1, except that, in forming the activation layer, a C60 fullerene and Compound A01 were co-deposited (at a weight ratio of 50:50) to form an activation layer having a thickness of 450 Å.

Example 8

An organic photodetector was manufactured in substantially the same manner as in Comparative Example 1, except that a $C_{60}$ fullerene having a thickness of 200 Å and Compound A01 having a thickness of 250 Å were sequentially deposited on the auxiliary layer to form an activation layer.

External quantum efficiency (EQE) with respect to a wavelength ranging from 580 nm to 590 nm, which is a peak wavelength of each of the organic photodetectors manufactured in Comparative Examples 1 to 3 and Example 2, was measured, and results thereof are shown in Table 1.

TABLE 1

| | EQE (%) @580-590 nm |
|---|---|
| Comparative Example 1 | 20.94 |
| Comparative Example 2 | 2.18 |
| Comparative Example 3 | 1.74 |
| Example 2 | 44.35 |

Referring to Table 1, it can be seen that Example 2 showed superior EQE to Comparative Examples 1 to 3 in the same device structure.

Figure 5:
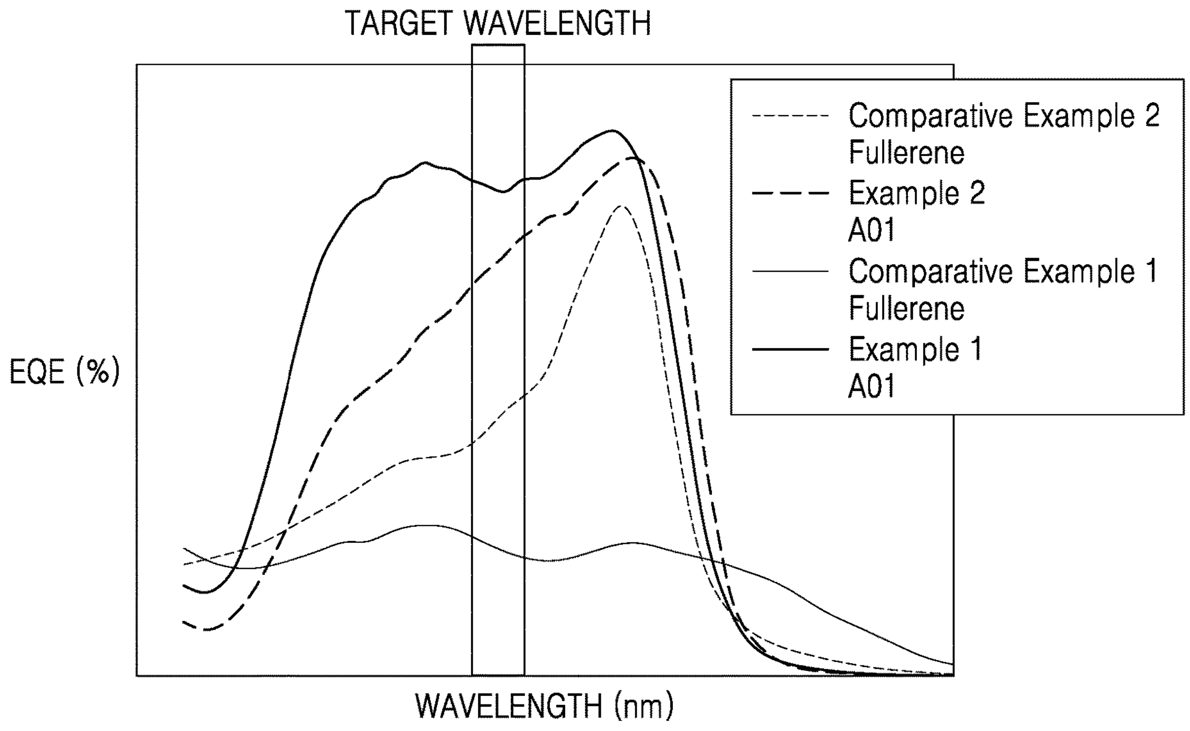
FIG. 5 is a graph showing external quantum efficiency of organic photodetectors of Comparative Examples and Examples.

In an embodiment, EQE with respect to a wavelength of each of the organic photodetectors manufactured in Comparative Example 1 and Examples 1 and 2 was measured, and results thereof are shown in FIG. 5.

Referring to FIG. 5, it can be seen that Examples 1 and 2 showed superior EQE to Comparative Example 1 at a target wavelength and a peak wavelength.

Figure 6:
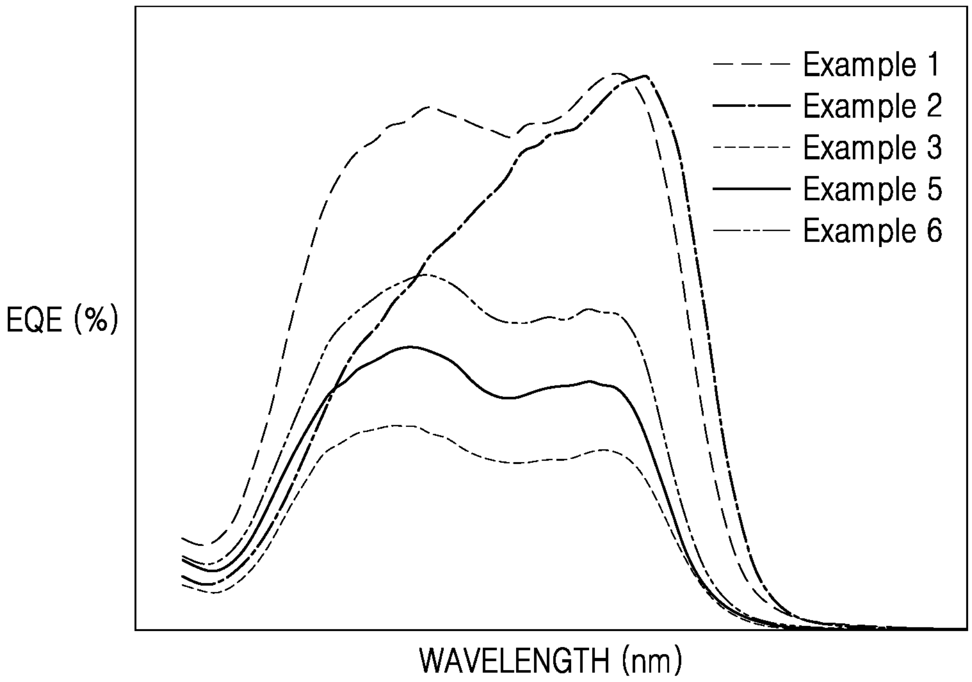
FIG. 6 is a graph showing external quantum efficiency of organic photodetectors of Examples.

EQE with respect to a wavelength of each of the organic photodetectors manufactured in Examples 1, 2, 3, 5, and 6 was measured, and results thereof are shown in FIG. 6.

Referring to FIG. 6, it can be seen that a graph shows different aspects according to a device structure.

While the subject matter of the present disclosure has been described with reference to embodiments illustrated in the drawings, these embodiments are provided herein for illustrative purposes only, and one of ordinary skill in the art may understand that the embodiments include various modifications and equivalent embodiments thereof. Accordingly, the true scope of the present disclosure should be determined by the scope of the appended claims, and equivalents thereof.

The organic photodetector according to an embodiment has excellent processability, mass production, and efficiency compared to those of a fullerene by using the compound represented by Formula 1 in the activation layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An electronic apparatus comprising an organic photodetector comprising:

a first electrode;

a second electrode facing the first electrode; and an activation layer between the first electrode and the second electrode, wherein the activation layer comprises a compound represented by Formula 1 below:

Formula 1

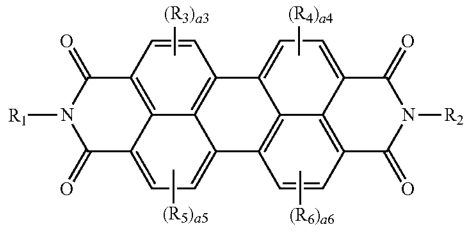

wherein, in Formula 1, $R_1$ to $R_6$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, an octyl group and a tridecyl group are excluded from $R_1$ and $R_2$, a3 to a6 are each independently an integer of 1 or 2, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The electronic apparatus of claim 1, wherein, in Formula 1, $R_1$ and $R_2$ are each independently a $C_1$-$C_{60}$ alkyl group that is unsubstituted or substituted with at least one $R_{10a}$, and $R_3$ to $R_6$ are each independently a $C_6$-$C_{60}$ aryl group that is unsubstituted or substituted with at least one $R_{10a}$ or a $C_1$-$C_{60}$ heteroaryl group that is unsubstituted or substituted with at least one $R_{10a}$.

3. The electronic apparatus of claim 1, wherein the activation layer comprises the compound represented by Formula 1 as an electron acceptor or an electron donor.

4. The electronic apparatus of claim 1, wherein the activation layer comprises: the compound represented by Formula 1; and an electron donor or an electron acceptor.

5. The electronic apparatus of claim 1, wherein the activation layer comprises: a layer comprising the compound represented by Formula 1; and a layer comprising an electron donor or an electron acceptor.

6. The electronic apparatus of claim 5, wherein the layer comprising the compound represented by Formula 1 and the layer comprising the electron donor or an electron acceptor are in contact with each other.

7. The electronic apparatus of claim 1, wherein the activation layer comprises a layer including a mixture of the compound represented by Formula 1 and an electron donor or an electron acceptor.

8. The electronic apparatus of claim 1, wherein the activation layer comprises a layer consisting of the compound represented by Formula 1.

9. The electronic apparatus of claim 1, wherein the activation layer comprises: a layer comprising an electron donor or an electron acceptor;

a layer comprising a mixture of the compound represented by Formula 1 and an electron donor or an electron acceptor; and a layer consisting of the compound represented by Formula 1.

10. The electronic apparatus of claim 9, wherein the layer comprising the electron donor or the electron acceptor and the layer comprising the mixture of the compound represented by Formula 1 and the electron donor or the electron acceptor are in contact with each other, and the layer comprising the mixture of the compound represented by Formula 1 and the electron donor or the electron acceptor and the layer consisting of the compound represented by Formula 1 are in contact with each other.

11. An organic photodetector comprising:

a first electrode;

a second electrode facing the first electrode; and an activation layer between the first electrode and the second electrode, wherein the activation layer comprises a compound represented by Formula 1 below:

Formula 1

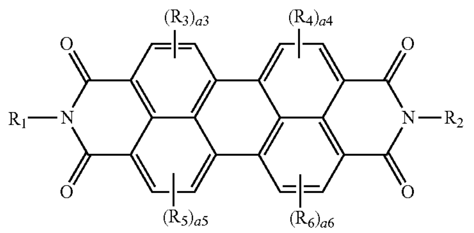

wherein, in Formula 1, $R_1$ to $R_6$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, an octyl group and a tridecyl group are excluded from $R_1$ and $R_2$, a3 to a6 are each independently an integer of 1 or 2, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein the activation layer comprises a layer comprising a mixture of a hole transporting material and the compound represented by Formula 1.

12. The electronic apparatus of claim 1, wherein the activation layer comprises a p-dopant.

13. The electronic apparatus of claim 1, wherein the first electrode is an anode, the second electrode is a cathode, the organic photodetector further comprises a hole transport region between the activation layer and the first electrode, and the hole transport region comprises a hole injection layer, a hole transport layer, an auxiliary layer, an electron blocking layer, or any combination thereof.

14. The electronic apparatus of claim 1, wherein the first electrode is an anode, the second electrode is a cathode, the organic photodetector further comprises an electron transport region between the activation layer and the second electrode, and the electron transport region comprises a buffer layer, a hole blocking layer, an electron transport layer, an electron injection layer, or any combination thereof.

15. The electronic apparatus of claim 1, further comprising a light-emitting device.

16. An electronic apparatus comprising: a substrate comprising a light detection region and an emission region;

an organic photodetector on the light detection region; and a light-emitting device on the emission region, wherein the organic photodetector comprises: a first pixel electrode; a counter electrode facing the first pixel electrode; and a hole transport region, an activation layer, and an electron transport region, which are sequentially between the first pixel electrode and the counter electrode, the light-emitting device comprises: a second pixel electrode; the counter electrode facing the second pixel electrode; and the hole transport region, an emission layer, and the electron transport region, which are sequentially between the second pixel electrode and the counter electrode, the first pixel electrode and the activation layer are arranged in correspondence with the light detection region, the second pixel electrode and the emission layer are arranged in correspondence with the emission region, the hole transport region, the electron transport region, and the counter electrode are arranged throughout the light detection region and the emission region, and the activation layer comprises a compound represented by Formula 1 below:

Formula 1

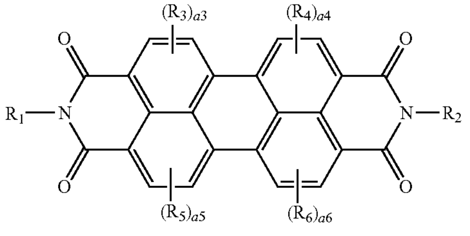

wherein, in Formula 1, $R_1$ to $R_6$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, an octyl group and a tridecyl group are excluded from $R_1$ and $R_2$, a3 to a6 are each independently an integer of 1 or 2, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

* * * * *